United States Patent
Sakakura et al.

(10) Patent No.: US 9,130,047 B2
(45) Date of Patent: Sep. 8, 2015

(54) SEMICONDUCTOR DEVICE

(71) Applicant: SEMICONDUCTOR ENERGY LABORATORY CO., LTD., Atsugi-shi, Kanagawa-ken (JP)

(72) Inventors: Masayuki Sakakura, Kanagawa (JP); Daisuke Matsubayashi, Kanagawa (JP); Yoshiyuki Kobayashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/338,575

(22) Filed: Jul. 23, 2014

(65) Prior Publication Data

US 2015/0034945 A1 Feb. 5, 2015

(30) Foreign Application Priority Data

Jul. 31, 2013 (JP) ................................. 2013-159512

(51) Int. Cl.
*H01L 29/78* (2006.01)
*H01L 29/786* (2006.01)
*H01L 27/12* (2006.01)

(52) U.S. Cl.
CPC ........ *H01L 29/7869* (2013.01); *H01L 27/1225* (2013.01); *H01L 29/7831* (2013.01)

(58) Field of Classification Search
CPC ............ H01L 29/7831; H01L 29/7869; H01L 27/1225
USPC ................................................ 257/365, 366
See application file for complete search history.

(56) References Cited

U.S. PATENT DOCUMENTS

| 4,466,081 A | 8/1984 | Masuoka |
| 5,731,856 A | 3/1998 | Kim et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(Continued)

*Primary Examiner* — Allan R Wilson
(74) *Attorney, Agent, or Firm* — Fish & Richardson P.C.

(57) ABSTRACT

A semiconductor device with a transistor in which current flowing between a source and a drain when the voltage of a gate electrode is 0 V can be reduced is provided. The semiconductor device incorporates a multi-gate transistor having an oxide semiconductor film formed over an insulating surface, a first gate insulating film in contact with a first surface of the oxide semiconductor film, a first gate electrode between the insulating surface and the oxide semiconductor film, a second gate insulating film in contact with a second surface of the oxide semiconductor film, and a second gate electrode in contact with the second gate insulating film. The oxide semiconductor film has a first region overlapping with the first gate electrode and a second region not overlapping with the first gate electrode, and the second gate electrode overlaps with the first region and the second region of the oxide semiconductor film.

12 Claims, 19 Drawing Sheets

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,626,205 | B2 * | 12/2009 | Ishiguro ............ 257/72 |
| 7,674,650 | B2 | 3/2010 | Akimoto et al. |
| 7,732,819 | B2 | 6/2010 | Akimoto et al. |
| 7,791,072 | B2 | 9/2010 | Kumomi et al. |
| 7,884,360 | B2 | 2/2011 | Takechi et al. |
| 7,892,898 | B2 | 2/2011 | Oba |
| 7,940,085 | B2 * | 5/2011 | Kim et al. ............ 326/83 |
| 7,994,579 | B2 | 8/2011 | Itai |
| 8,067,775 | B2 | 11/2011 | Miyairi et al. |
| 8,106,400 | B2 | 1/2012 | Miyairi et al. |
| 8,148,779 | B2 | 4/2012 | Jeong et al. |
| 8,203,143 | B2 | 6/2012 | Imai |
| 8,217,680 | B2 * | 7/2012 | Kim et al. ............ 326/83 |
| 8,237,166 | B2 | 8/2012 | Kumomi et al. |
| 8,405,092 | B2 | 3/2013 | Inoue et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 * | 6/2008 | Lee et al. ............ 257/43 |
| 2008/0128705 | A1 * | 6/2008 | Ishiguro ............ 257/72 |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0012112 | A1 * | 1/2011 | Yamazaki et al. ............ 257/57 |
| 2011/0089419 | A1 | 4/2011 | Yamazaki et al. |
| 2011/0101351 | A1 | 5/2011 | Yamazaki |
| 2012/0026787 | A1 * | 2/2012 | Uochi et al. ............ 365/163 |
| 2012/0061668 | A1 | 3/2012 | Miyairi et al. |
| 2012/0104386 | A1 | 5/2012 | Miyairi et al. |
| 2013/0168670 | A1 | 7/2013 | Inoue et al. |
| 2013/0285050 | A1 | 10/2013 | Yamazaki et al. |
| 2014/0014955 | A1 * | 1/2014 | Saito ............ 257/43 |
| 2014/0110704 | A1 | 4/2014 | Yamazaki et al. |
| 2014/0110706 | A1 | 4/2014 | Yamazaki |
| 2014/0131700 | A1 | 5/2014 | Yamazaki |
| 2014/0131702 | A1 | 5/2014 | Matsubayashi et al. |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2011-109084 | A | 6/2011 |
| JP | 2011-181801 | A | 9/2011 |
| WO | WO-2004/114391 | | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

(56) References Cited

OTHER PUBLICATIONS

Chern.H et al., "An Analytical Model for the Above-Threshold Characteristics of Plysilicon Thin-Film Transistors", IEEE Transactions on Electron Devices, Jul. 1, 1995, vol. 42, No. 7, pp. 1240-1246.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and its Blue PHase", Phys. Rev. A (PHysical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced At Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects In ZnO", Phys. Rev. B (Physical Review. B), Oct. 4, 2007, vol. 76, No. 16, pp. 165202-1-165202-22.
Janotti.A et al., "Oxygen Vacancies In ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YeFe2O4, andYb2Fe3O7 Types of Structures for Compounds in the In2O3 and Sc2O3—A2O3—BO Systems [A; Fe, Ga, or Al; B: Mg, Mn, Fe, Ni, Cu, Or Zn] at Temperatures over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m=3, 4, and 5), InGaO3(ZnO)3, and Ga2o3(ZnO)m (m=7,8, 9, and 16) in the In2O3—ZnGa2O4—ZnO System", Journal of Solid Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1603.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th Internaional Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 2991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", JPN. J. Appl. Phys. (Japanese Journal of Applied Physics) , 2006, vol. 45, No. 5B, pp. 4303-4308.

(56) References Cited

OTHER PUBLICATIONS

Nomura.K et al., "Carrier transport in transparent oxide semiconductor with intrinsic structural randomness probed using single-crystalline InGaO3(ZnO)5 films", Appl. Phys. Lett. (Applied Phsyics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID Internatoinal Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectrics Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors By Ar Plasma Treatement", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 29-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFT", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a driving method thereof, or a manufacturing method thereof. In particular, one embodiment of the present invention relates to a multi-gate transistor or a semiconductor device with a multi-gate transistor.

Note that in this specification or the like, a semiconductor device refers to any device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), a high-voltage device having higher withstand voltage than silicon, an integrated circuit or power supply circuit or power converter circuit with the high-voltage device, and an electronic appliance may have a semiconductor device.

2. Description of the Related Art

A technique by which transistors are formed using semiconductor thin films formed over a substrate having an insulating surface has been attracting attention. The transistor is used in a wide range of electronic devices such as an integrated circuit (IC) or an image display device (also simply referred to as a display device). As semiconductor thin films that can be used for the transistors, silicon-based semiconductor materials have been widely known, but oxide semiconductors have been attracting attention as alternative materials.

A transistor using an oxide semiconductor material has small off-state current. Thus, a potential of a node (the amount of charge held in the node) which is brought into a floating state when the transistor is turned off can be held for a long time. Accordingly, it is expected that a memory device is fabricated using the transistor. For example, Patent Document 1 discloses a memory device with a dynamic random access memory (DRAM) including the transistor in a memory cell.

REFERENCE

Patent Document

[Patent Document 1] Japanese Published Patent Application No. 2011-109084

SUMMARY OF THE INVENTION

An object of one embodiment of the present invention is to provide a semiconductor device having a transistor capable of reducing current flowing between a source and a drain when a gate voltage is 0 V. Another object of the present invention is to provide a semiconductor device with small variations in transistor characteristics. Another object of one embodiment of the present invention is to provide a semiconductor device in which large current can flow. Another object of one embodiment of the present invention is to provide a semiconductor device that is reliably driven with a high driving voltage. Another object of one embodiment of the present invention is to provide a semiconductor device that can operate at a high temperature. Another object of one embodiment of the present invention is to provide a semiconductor device with low power consumption. Another object of one embodiment of the present invention is to provide a highly reliable semiconductor device. Another object of one embodiment of the present invention is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device having a multi-gate transistor in which a single-gate transistor and a dual-gate transistor are connected in series.

One embodiment of the present invention is a semiconductor device with a multi-gate transistor including an oxide semiconductor film over an insulating surface; a first gate insulating film in contact with a first surface of the oxide semiconductor film; a first gate electrode between the insulating surface and the oxide semiconductor film; a second gate insulating film in contact with a second surface of the oxide semiconductor film; and a second gate electrode in contact with the second gate insulating film. The oxide semiconductor film has a first region that overlaps with the first gate electrode and a second region that does not overlap with the first gate electrode. The second gate electrode overlaps with the first region and the second region of the oxide semiconductor film.

The multi-gate transistor may include a first conductive film and a second conductive film which are in conduct with the oxide semiconductor film and overlap with the first gate electrode and the second gate electrode, and a third conductive film which is in contact with the oxide semiconductor film and overlaps with the second gate electrode. It is preferable that a potential lower than that applied to the first conductive film be applied to the first gate electrode.

Another embodiment of the present invention is a semiconductor device with a multi-gate transistor in which a first element and a second element are connected in series. The first element includes a first oxide semiconductor film over an insulating surface; a first gate insulating film in contact with a first surface of the first oxide semiconductor film; a first gate electrode between the insulating surface and the first oxide semiconductor film; a second gate insulating film in contact with a second surface of the first oxide semiconductor film; and a second gate electrode in contact with the second gate insulating film. The second element includes the first gate insulating film; the second gate insulating film; a second oxide semiconductor film with one surface in contact with the first gate insulating film and another surface in contact with the second insulating film; and the second gate electrode in contact with the second gate insulating film. The second gate electrode overlaps with the first oxide semiconductor film and the second oxide semiconductor film.

The first element may include a first conductive film and a second conductive film which are in contact with the first oxide semiconductor film, and the second element may include the second conductive film and a third conductive film which are in contact with the second oxide semiconductor film. It is preferable that a potential lower than that applied to the first conductive film be applied to the first gate electrode.

In accordance with one embodiment of the present invention, a semiconductor device with a transistor in which current flowing between a source and a drain when the gate voltage is 0 V is reduced, or a semiconductor device with small variations in transistor characteristics can be provided. Alternatively, in accordance with one embodiment of the present invention, a semiconductor device with a transistor in which large current can flow in an on-state can be provided. Alternatively, in accordance with one embodiment of the present invention, a semiconductor device that is reliably driven with a high driving voltage can be provided. Alternatively, in accordance with one embodiment of the present invention, a semiconductor device that can operate at a high temperature can be provided. Alternatively, in accordance with one embodiment of the present invention, a semiconductor device with less power consumption can be provided. Alternatively, in accordance with one embodiment of the present invention, a highly reliable semiconductor device can be provided.

DETAILED DESCRIPTION OF THE INVENTION

Figure 1A:
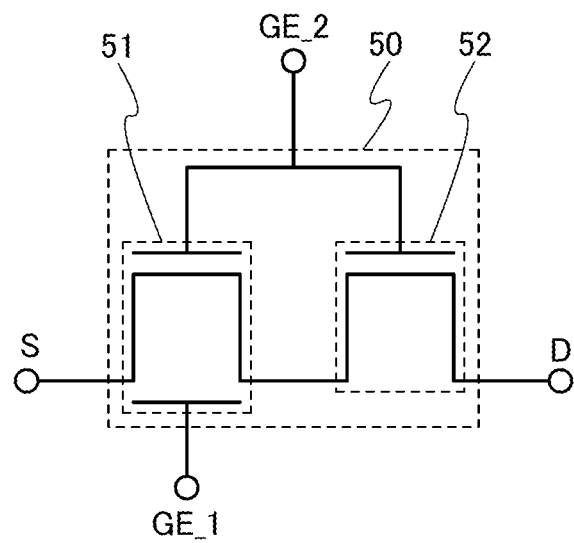
FIGS. 1A and 1B illustrate a semiconductor device of an embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is used for portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

Functions of a "source" and a "drain" are sometimes replaced with each other when the direction of current flow is changed in circuit operation, for example. Therefore, the terms "source" and "drain" can be used to denote the drain and the source, respectively, in this specification.

A voltage refers to a difference in potential between two points, and a potential refers to electrostatic energy (electric potential energy) of a unit charge at a given point in an electrostatic field. Note that in general, a difference between a potential of one point and a reference potential (e.g., a ground potential) is simply called a potential or a voltage, and a potential and a voltage are used as synonymous words in many cases. Thus, in this specification, a potential may be rephrased as a voltage and a voltage may be rephrased as a potential unless otherwise specified.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Embodiment 1

In this embodiment, a structural example of a multi-gate transistor in a semiconductor device of one embodiment of the present invention will be described with reference to drawings.

A transistor in a semiconductor device of this embodiment will be described with reference to FIGS. 1A and 1B and FIGS. 2A to 2D.

FIG. 1A is a circuit diagram of a transistor 50. The transistor 50 is a multi-gate transistor in which a dual-gate transistor 51 and a single-gate transistor 52 are connected in series between a source terminal S and a drain terminal D.

In this specification, a multi-gate transistor refers to a transistor with a structure in which a plurality of gate electrodes are connected in series between a source terminal and a drain terminal such that a plurality of channel regions are connected in series via low-resistance regions. In addition, a dual-gate transistor refers to a transistor with a structure in which a semiconductor film is sandwiched between two gate electrodes.

In the dual-gate transistor 51, one of a source electrode and a drain electrode is connected to the source terminal S, and the other is connected to one of a source electrode and a drain electrode of the transistor 52. A first gate electrode is connected to a first gate terminal GE_1 and a second gate electrode is connected to a second gate terminal GE_2.

In the single-gate transistor 52, one of the source electrode and the drain electrode is connected to the transistor 51, and the other is connected to the drain terminal D. A gate electrode is connected to the second gate terminal GE_2.

A potential for controlling the threshold voltage of the transistor 51 is applied to the first gate terminal GE_1. It is preferable that a potential lower than that applied to the source or drain electrode connected to the source terminal S be applied to the first gate electrode of the transistor 51. As a result, the threshold voltage of the transistor 51 can be shifted in the positive direction.

A potential for controlling the on/off states of the transistors 51 and 52 is applied to the second gate terminal GE_2. That is, the on/off states of the transistors 51 and 52 and the multi-gate transistor 50 are controlled by the potential applied to the second gate electrode of the transistor 51 and the gate electrode of the transistor 52.

Figure 1B:
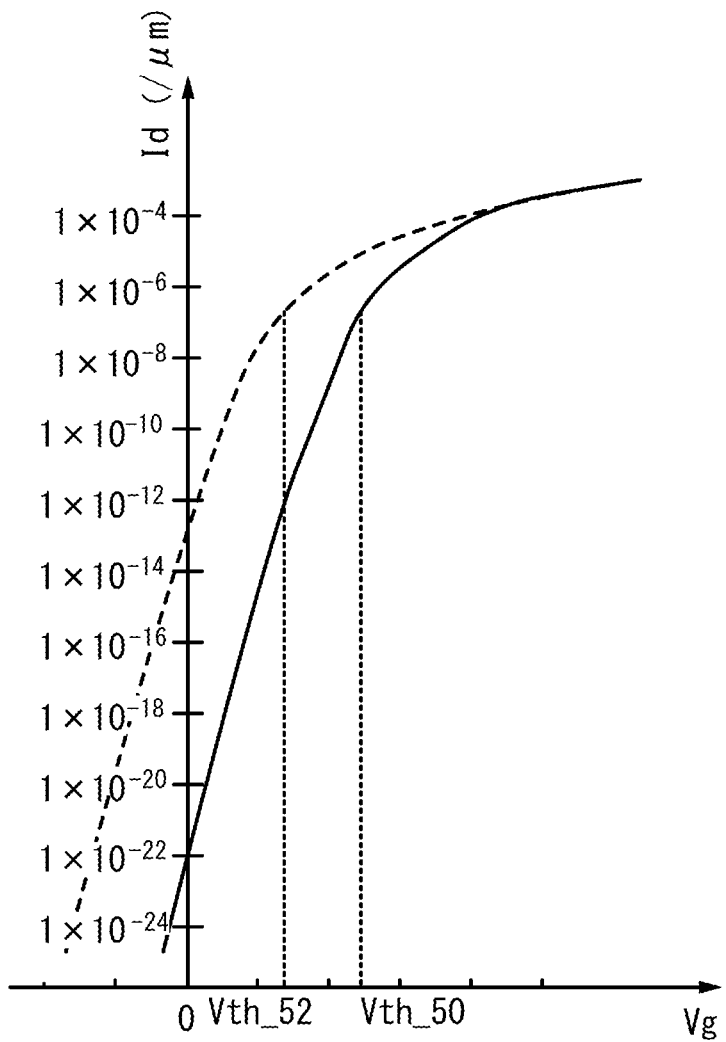

In FIG. 1B schematically illustrates transistor characteristics of the multi-gate transistor 50 and the single-gate transistor 52. The horizontal axis of FIG. 1B represents the voltage of the gate electrode of the transistor 50 and the voltage of the gate electrode of the transistor 52. The vertical axis represents current $I_d$ per micrometer of a channel width (A/μm) between the source and drain electrodes at room temperature. In the measurement of the transistor characteristics, the voltage of the source electrode is set to 0 V and the voltage of the drain electrode is set to +1 V. Note that current smaller than 1 fA is difficult to be measured directly in the case where the voltage of the gate electrode is 0 V or lower. However, off-state current can be measured with the use of a circuit in which a capacitor and a transistor are connected and the transistor controls electric charges flowing into or from the capacitor.

In FIG. 1B, a solid curve indicates characteristics of the multi-gate transistor 50 and a dashed curve indicates characteristics of the single-gate transistor 52. The threshold-voltage of the transistor 50 is denoted by $V_{th}\_50$ and the threshold-voltage of the transistor 52 is denoted by $V_{th}\_52$.

Compared to the threshold-voltage $V_{th}\_52$ of the single-gate transistor 52, the threshold-voltage $V_{th}\_50$ of the multi-gate transistor 50 is increased (shifted in the positive direction).

For the dual-gate transistor 51, when a positive voltage is applied to the second gate electrode and a voltage lower than that applied to the source or drain electrode connected to the source terminal S is applied to the first gate electrode, the threshold voltage increases (shifted in the positive direction) compared to the single gate transistor 52.

Since the transistor 51 and the transistor 52 are connected in series in the multi-gate transistor 50, the transistor 50 is in an off state when a gate voltage that is higher than the threshold voltage of the transistor 52 but is lower than the threshold voltage of the transistor 51 is applied. That is, the multi-gate transistor 50 is turned on when a voltage higher than or equal to the threshold voltage of the transistor 51 is applied to the second gate electrode. By connecting the single-gate transistor and the dual-gate transistor in series, the threshold voltage of the multi-gate transistor 50 can be increased (shifted in the positive direction).

In the case where a voltage lower than that applied to the source or drain electrode connected to the source terminal S is applied to the first gate electrode of the transistor 51, it is preferable that the channel length of the transistor 52 (L_52) be greater than the channel length of the transistor 51 (L_51). As a typical example, the channel length of the transistor 52 (L_52) is greater than the channel length of the transistor 51 (L_51), preferably twice or more, further preferably three times or more, whereby the threshold voltage of the multi-gate transistor 50 can be increased (shifted in the positive direction). As a result, current flowing between the source and the drain when the voltage of the gate electrode is 0 V can be reduced, which leads to lower power consumption. Furthermore, by minimizing the channel length of the transistor 51 within design rules, a multi-gate transistor with a minute structure can be manufactured.

Although the channel width of the transistor 51 and the channel width of the transistor 52 may be the same, the channel width of the transistor 51 may be greater than one time and less than ten times that of the transistor 52, preferably greater than one time and less than three times that of the transistor 52, whereby the on-state current of the transistor 51 can be increased. As a result, the threshold voltage of the multi-gate transistor 50 can be increased (shifted in the positive direction), and at the same time, the on-state current can rise sharply in a subthreshold region of the $I_d$-$V_g$ characteristics of the transistor. Consequently, current flowing between the source and the drain when the voltage of the gate electrode is 0 V can be reduced, which leads to lower power consumption.

The threshold voltage of the multi-gate transistor 50 is increased (shifted in the positive direction), whereby current ($I_d$/μm) flowing between the source electrode and the drain electrode when the gate voltage $V_g$ is 0 V is reduced to 1 fA/μm ($1 \times 10^{-15}$ A/μm) or less: for example, greater than or equal to 1 aA/μm ($1 \times 10^{-18}$ A/μm) and less than or equal to 1 fA/μm, preferably greater than or equal to 1 zA/μm ($1 \times 10^{-21}$ A/μm) and less than or equal to 1 aA/μm, more preferably greater than or equal to 1 yA/μm ($1 \times 10^{-24}$ A/μm) and less than or equal to 1 zA/μm. Therefore, power consumption of the multi-gate transistor in an off state can be reduced. Thus, power consumption of the semiconductor device can be reduced.

In addition, concentration of electric field around the drain of the multi-gate transistor 50 can be relaxed, which leads to an improvement in withstand voltage between the source and the drain (also referred to as drain withstand voltage).

Alternatively, a voltage for controlling the on state of the transistor 51 may be applied to the first gate electrode and the second gate electrode. For example, the same voltage is applied to the first gate electrode and the second gate electrode. As a result, a channel region to be formed in a semiconductor film is expanded and the field-effect mobility of the multi-gate transistor 50 is improved, whereby the on-state current can be increased.

Alternatively, for the transistor 51, a voltage lower or higher than that applied to the second gate electrode may be applied to the first gate electrode. Further alternatively, a voltage with different rise or fall timing from that of a voltage applied to the second gate electrode may be applied to the first gate electrode.

Figure 19A:
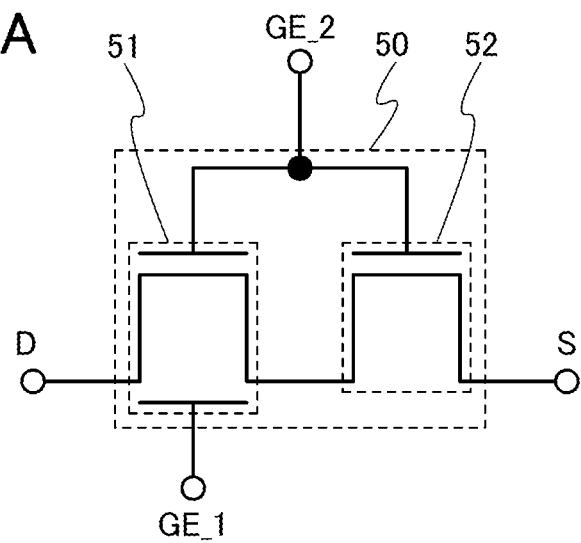
FIGS. 19A to 19C each illustrate a semiconductor device of an embodiment.

Note that the circuit configuration is not limited to the configuration in FIG. 1A. For example, the source and the drain may be switched as shown in FIG. 19A.

Figure 19B:
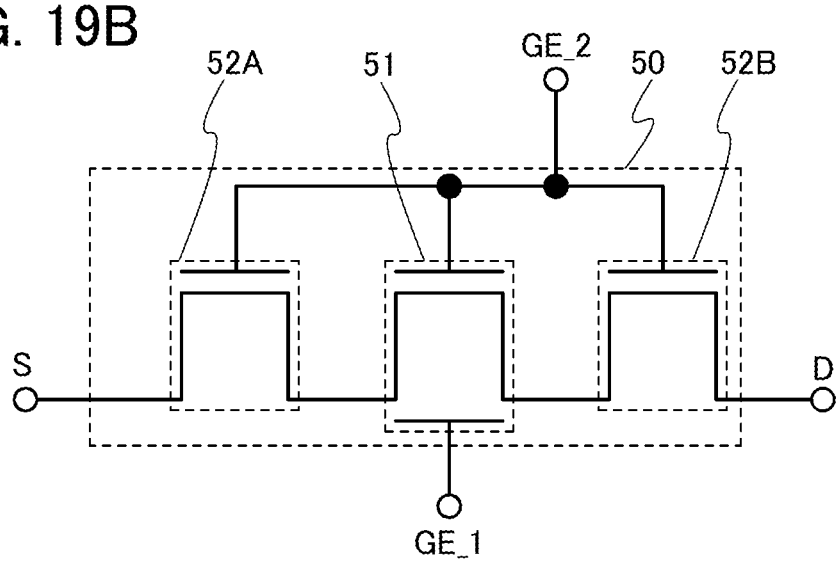

Alternatively, a configuration shown in FIG. 19B can be employed in which a single-gate transistor 52A, a dual-gate transistor 51, and a single-gate transistor 52B are connected in series in this order. In that case, a first gate electrode of the dual-gate transistor 51 is connected to a first gate terminal GE_1. In addition, a gate electrode of the single-gate transistor 52A, a second gate electrode of the dual-gate transistor 51, and a gate electrode of the single-gate transistor 52B are connected to a second gate terminal GE_2.

Figure 19C:
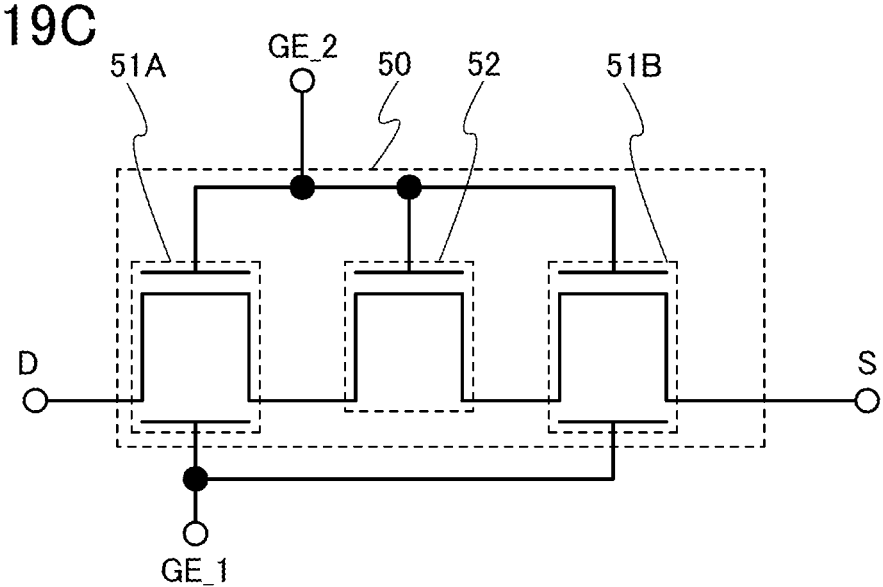

Further alternatively, a configuration shown in FIG. 19C can be employed in which a dual gate transistor 51A, a single-gate transistor 52, and a dual-gate transistor 51B are connected in series in this order. In that case, a first gate electrode of each of the dual gate transistors 51A and 51B is connected to a first gate terminal GE_1. A second gate electrode of the dual-gate transistor 51A, a gate electrode of the single-gate transistor 52, and a second gate electrode of the dual-gate transistor 51B are connected to a second gate terminal GE_2.

In FIG. 19C, the first gate electrode of the dual-gate transistor 51A and the first gate electrode of the dual-gate transistor 51B may be connected to different gate terminals without connected to each other.

Next, s more specific structural example of a multi-gate transistor and the manufacturing method will be described with reference to drawings. Here, a transistor will be described as an example of a semiconductor device. Note that portions similar to those described above are not described in some cases.

Structural Example

Figure 2A:
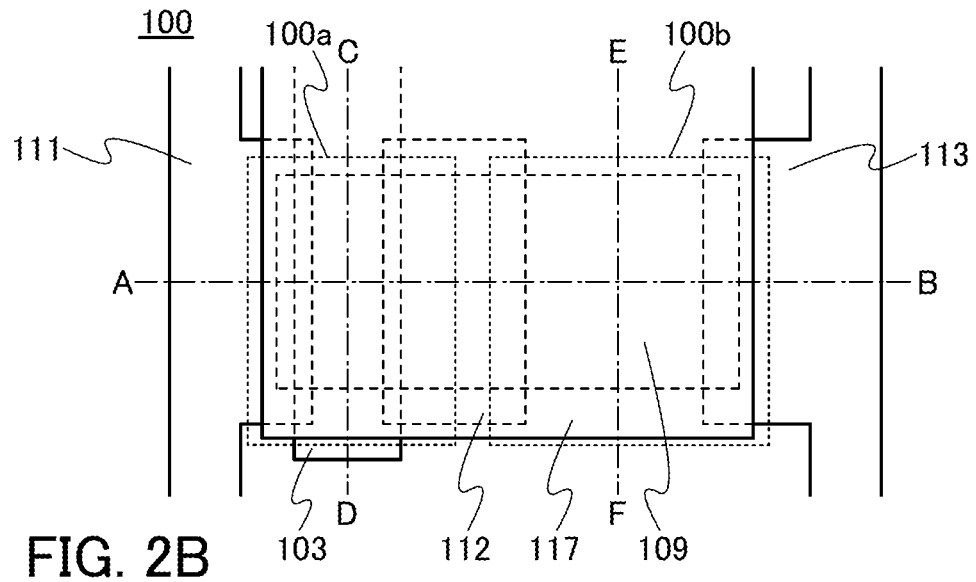
FIGS. 2A to 2D illustrate a semiconductor device of an embodiment.
Figure 2B:
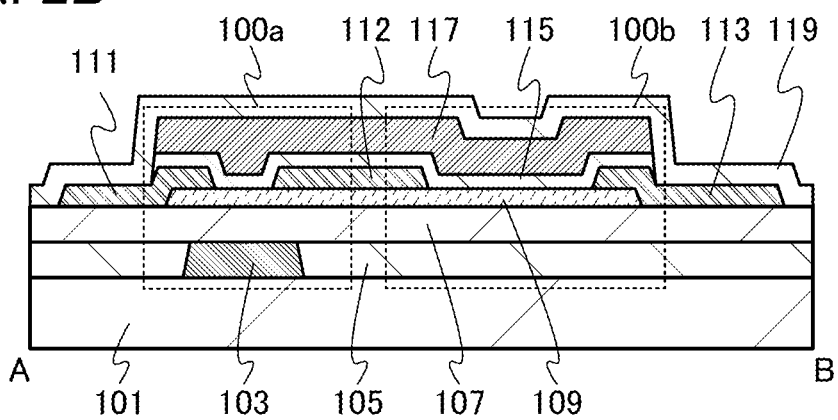
Figure 2C:
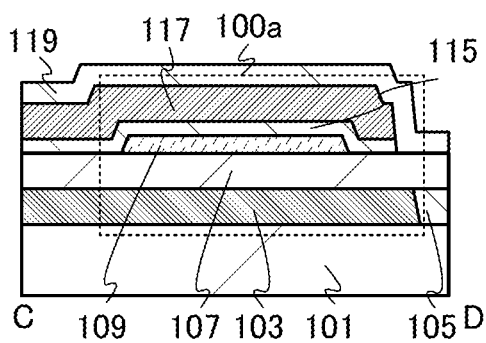
Figure 2D:
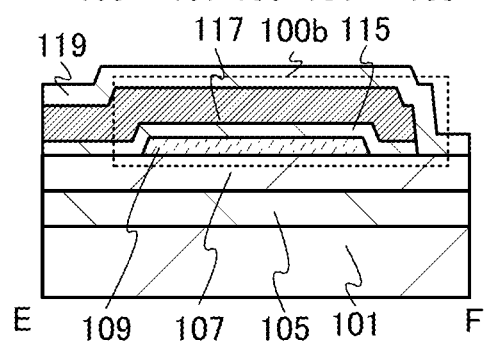

FIG. 2A is a schematic top view of a multi-gate transistor 100. FIGS. 2B, 2C, and 2D are schematic cross-sectional views taken along lines A-B, C-D, and E-F in FIG. 2A, respectively. Note that some components are not illustrated in FIG. 2A for simplicity. In some cases, the direction of the line A-B is referred to as a channel length direction, and the direction of the line C-D or E-F is referred to as a channel width direction.

The channel length refers to a distance between a source (source region or source electrode) and a drain (drain region or drain electrode) in a region where a semiconductor film and a gate electrode overlap with each other in the top view. The channel width refers to the length of a portion where a source and a drain face each other in parallel and where the semiconductor film 109 and a gate electrode 117 overlap with each other.

That is, in a transistor 100a shown in FIG. 2A, the channel length corresponds to the distance between a conductive film 111 and a conductive film 112 in a region where a semiconductor film 109 and a gate electrode 117 overlap with each other, and the channel width corresponds to the length of a portion where the conductive film 111 and the conductive film 112 face each other in parallel and where the semiconductor film 109 and the gate electrode 117 overlap with each other.

In a transistor 100b shown in FIG. 2A, the channel length corresponds to the distance between the conductive film 112 and a conductive film 113 in a region where the semiconductor film 109 and the gate electrode 117 overlap with each other, and the channel width corresponds to the length of a portion where the conductive film 112 and the conductive film 113 face each other in parallel and where the semiconductor film 109 and the gate electrode 117 overlap with each other.

In the multi-gate transistor 100, the dual-gate transistor 100a and the single-gate transistor 100b are connected in series.

The transistor 100a includes the island-shaped semiconductor film 109 provided over a substrate 101, a gate electrode 103 between the substrate 101 and the semiconductor film 109, an insulating film 107 in contact with the semiconductor film 109 between the gate electrode 103 and the semiconductor film 109, the conductive films 111 and 112 in contact with the semiconductor film 109, an insulating film 115 in contact with the semiconductor film 109, and the gate electrode 117 overlapping with the semiconductor film 109 with the insulating film 115 provided therebetween.

In the transistor 100a, the insulating film 107 and the insulating film 115 each serve as a gate insulating film.

The transistor 100b includes the island-shaped semiconductor film 109 in contact with the insulating film 107, the conductive films 112 and 113 in contact with the semiconductor film 109, the insulating film 115 in contact with the semiconductor film 109, and the gate electrode 117 overlapping with the semiconductor film 109 with the insulating film 115 provided therebetween.

In the transistor 100b, the insulating film 115 serves as a gate insulating film.

The conductive film 111 serves as a source electrode of the multi-gate transistor 100, and the conductive film 113 serves as a drain electrode of the multi-gate transistor 100.

In the multi-gate transistor 100, the dual-gate transistor 100a and the single-gate transistor 100b are connected in series by sharing the semiconductor film 109, the conductive film 112, and the gate electrode 117.

In the multi-gate transistor 100 shown in FIGS. 2A to 2D, an insulating film 105 is provided in contact with the side surfaces of the gate electrode 103. It is preferable that planarization treatment be performed on the top surfaces of the gate electrode 103 and insulating film 105 so that the top surfaces are at the same level. When at least a portion under the semiconductor film 109 is planarized, uniformity in thickness or quality of the semiconductor film 109 improves, so that the stability of the electrical characteristics of the transistor increases and variations in electrical characteristics of the transistor decrease. In the case where the film thickness of the gate electrode 103 is small, the insulating film 105 need not necessarily be provided.

As shown in FIG. 2C, in the cross-section of the transistor 100 in the channel width direction, the semiconductor film 109 is sandwiched between the gate electrode 103 and the gate electrode 117. In addition, the gate electrode 117 is provided so as to cover not only the top surface but also the edges in the channel width direction of the semiconductor film 109. With this structure, an electric field from the gate electrode 117 is applied not only longitudinally but also laterally to the semiconductor film 109. Therefore, a region where a channel is formed in the semiconductor film 109 is expanded and the on-state current of the transistor 100 can be further increased.

Next, each component of the multi-gate transistor 100 will be described.

<Semiconductor Film 109>

Although the semiconductor film 109 may contain a semiconductor such as silicon in a region where a channel is formed, it preferably contains a semiconductor with a wider band gap than silicon. The semiconductor film 109 preferably contains an oxide semiconductor. As a semiconductor other than an oxide semiconductor, silicon carbide, gallium nitride, or diamond whose band gap is wider than that of silicon may be used, besides silicon. However, in view of the ease of manufacture, the stability of electrical characteristics, and the like, an oxide semiconductor is preferably used.

A case in which an oxide semiconductor is used for the semiconductor film 109 will be described below, unless otherwise specified.

The oxide semiconductor preferably contains at least indium (In) or Zinc (Zn). More preferably, the oxide semiconductor contains an oxide represented by an In-M-Zn-based oxide (M is a metal such as Al, Ti, Ga, Ge, Y, Zr, Sn, La, Ce, or Hf).

An oxide semiconductor having a wider band gap than silicon is used in the semiconductor film 109 in which a channel is formed, whereby a change in the electrical characteristics of the transistor can be made extremely small even at a high temperature. That is, by using an oxide semiconductor in the semiconductor film 109, a transistor that can operate stably at a high temperature can be obtained.

Moreover, an oxide semiconductor having a wider band gap than silicon is used for the semiconductor film 109, whereby resistance to hot-carrier degradation can be increased, and a high drain withstand voltage can be given to the transistor. Thus, a transistor that is driven stably at a high driving voltage can be obtained.

Here, the hot-carrier degradation means deterioration of transistor characteristics, e.g., shift in threshold voltage or gate leakage, which is caused as follows: electrons that are accelerated to be rapid are injected in the vicinity of a drain in a channel into a gate insulating film and become fixed electric charge, trap levels at the interface between the gate insulating film and the oxide semiconductor are formed, or the like. The factors of the hot-carrier degradation are, for example, channel-hot-electron injection (CHE injection) and drain-avalanche-hot-carrier injection (DAHC injection).

Since the band gap of silicon is narrow, electrons are likely to be generated like an avalanche owing to an avalanche breakdown, and the number of electrons that are accelerated to be so rapid as to go over a barrier to the gate insulating film is increased. However, the oxide semiconductor in this embodiment has a wide band gap; therefore, the avalanche breakdown is unlikely to occur and resistance to the hot-carrier degradation is higher than that of silicon.

As described above, it can be said that the transistor has a high drain withstand voltage. Therefore, such a transistor is suitable for a high-voltage device having higher withstand voltage than silicon, such as an insulated-gate field-effect transistor (IGFET).

In addition, an oxide semiconductor having a wider band gap and a lower carrier density than silicon is preferably used for the semiconductor film 109 because off-state leakage current can be reduced.

The semiconductor film 109 may be a single layer of an oxide semiconductor film, or a stacked layer of oxide semiconductor films with different compositions.

For example, in the case where two oxide semiconductor films are stacked, for an oxide semiconductor film closer to the gate electrode 117, a material whose energy at the bottom of the conduction band is higher than that of the other oxide semiconductor film is used. Alternatively, three or more oxide semiconductor films are stacked, and use, for an oxide semiconductor film to be sandwiched between the other oxide semiconductor films, a material whose energy at the bottom of the conduction band is lower than those of the other oxide semiconductor films. With this structure, a channel is formed mainly in the oxide semiconductor film whose energy at the bottom of the conduction band is the lowest.

In the case where an In-M-Zn oxide is used for the oxide semiconductor film, as the proportion of In to M in the film becomes higher, the energy at the bottom of the conduction band can be further reduced. As the proportion of Zn becomes higher, the stability of the crystal structure can be increased. As the proportion of M becomes higher, release of oxygen from the oxide semiconductor film can be suppressed.

An oxide semiconductor film is provided to be in contact with an oxide semiconductor film in which a channel is mainly formed and which serves as a main current path, and to contain the same constituent element; thus, the formation of interface states of the films can be inhibited and the reliability of the electrical characteristics of the transistor can be improved. Moreover, a material in which the proportion of M in an atomic ratio is high is used for the oxide semiconductor film that is provided in contact with the oxide semiconductor film in which the channel is mainly formed, so that the oxygen vacancies in the oxide semiconductor film in which the channel is mainly formed can be reduced.

Details of a preferable mode and a forming method of an oxide semiconductor that can be used for the semiconductor film 109 will be described in an embodiment later. Furthermore, in the case where the semiconductor film 109 is formed using an oxide semiconductor, the contact of the conductive film 112 with the semiconductor film 109 can form the low-resistance region in the semiconductor film 109.

<Substrate 101>

There is no particular limitation on the property of a material and the like of the substrate 101 as long as the material has high enough heat resistance to withstand at least heat during the process. For example, a glass substrate, a ceramic substrate, a quartz substrate, a sapphire substrate, or an yttria-stabilized zirconia (YSZ) substrate may be used as the substrate 101. Alternatively, a single crystal semiconductor substrate or a polycrystalline semiconductor substrate made of silicon or silicon carbide, a compound semiconductor substrate made of silicon germanium or the like, an SOI substrate, or the like can be used.

Still alternatively, any of the above-described semiconductor substrates or the SOI substrate provided with a semiconductor element may be used as the substrate 101. In that case, the multi-gate transistor 100 is formed over the substrate 101 with an interlayer insulating film provided therebetween. The multi-gate transistor 100 in that case may have a structure in which at least one of the gate electrodes 103 and 117 and conductive films 111, 112, and 113 is electrically connected to the semiconductor element provided over the semiconductor substrate or the SOI substrate, via a connection electrode embedded in the interlayer insulating film. Forming the multi-gate transistor 100 over the semiconductor element with the interlayer insulating film provided therebetween can suppress an increase in area due to the formation of the transistor 100.

<Gate Electrodes 103 and 117>

The gate electrodes 103 and 117 can be formed using a metal selected from aluminum, chromium, copper, tantalum, titanium, molybdenum, and tungsten; an alloy containing any of these metals as a component; an alloy containing any of these metals in combination; or the like. Further, one or more metals selected from manganese and zirconium may be used. Alternatively, a semiconductor typified by polycrystalline silicon doped with an impurity element such as phosphorus, or a silicide such as nickel silicide may be used. Each of the gate electrodes 103 and 117 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film containing aluminum and one or more metals selected from titanium, tantalum, tungsten, molybdenum, chromium, neodymium, and scandium; or a nitride film of the alloy film may be used.

The gate electrodes 103 and 117 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Each of the gate electrodes 103 and 117 may also have a stacked-layer structure formed using the above light-transmitting conductive material and the above metal.

<Insulating Films 107 and 115>

The insulating films 107 and 115 each serve as a gate insulating film.

Each of the insulating films 107 and 115 may be formed to have a single-layer structure or a stacked-layer structure using, for example, one or more of silicon oxide, silicon oxynitride, silicon nitride oxide, aluminum oxide, hafnium oxide, gallium oxide, Ga—Zn-based metal oxide, silicon nitride, and the like.

The gate insulating films 107 and 115 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

At least one of the insulating films 107 and 115 preferably contains a film that releases oxygen when being heated. For example, an insulating film having an oxygen-excess region may be used. As the insulating film having an oxygen-excess region, an oxide insulating film that contains oxygen in excess of the stoichiometric composition is preferably used, for example. Such an oxide insulating film releases part of the oxygen when being heated.

Through the heat treatment in manufacture of the transistor, oxygen released from the insulating films 107 and 115 is supplied to the semiconductor film 109, thereby filling oxygen vacancies in the semiconductor film 109. Consequently, the oxygen vacancies in the semiconductor film 109 can be reduced.

<Conductive Films 111, 112, and 113>

Each of the conductive films 111, 112, and 113 is formed to have a single-layer structure or a stacked-layer structure using any of metals such as aluminum, titanium, chromium, nickel, copper, yttrium, zirconium, molybdenum, silver, tantalum, and tungsten, or an alloy containing any of these metals as a main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. A transparent conductive material containing indium oxide, tin oxide, or zinc oxide may be used.

The conductive film 111 serves as the source electrode of the multi-gate transistor 100, and the conductive film 113 serves as the drain electrode of the multi-gate transistor 100.

<Insulating Film 105>

The insulating film 105 may have a function of preventing diffusion of impurities contained in the substrate 101 in addition to a function of supplying oxygen to the semiconductor film 109.

As the insulating film 105, an oxide insulating film that contains more oxygen than that in the stoichiometric composition is preferably used. Part of oxygen is released by heating from the oxide insulating film containing oxygen at a higher proportion than that in the stoichiometric composition. The oxide insulating film containing oxygen at a higher proportion than that in the stoichiometric composition is an oxide insulating film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis. Note that the substrate temperature in the TDS analysis is preferably higher than or equal to 100° C. and lower than or equal to 700° C., or higher than or equal to 100° C. and lower than or equal to 500° C.

With the use of such an insulating film as the insulating film 105, oxygen is supplied to the semiconductor film 109 through heat treatment or the like in the manufacturing process, which makes it possible to reduce oxygen vacancies in the semiconductor film 109.

<Insulating Film 119>

For an insulating film 119, a material relatively impermeable to oxygen can be used. Furthermore, it is preferable that the insulating film 119 be relatively impermeable to hydrogen or water. As the material relatively impermeable to oxygen, which can be used for the insulating film 119, an insulating material such as silicon nitride, silicon nitride oxide, aluminum oxide, aluminum oxynitride, gallium oxide, gallium oxynitride, yttrium oxide, yttrium oxynitride, hafnium oxide, or hafnium oxynitride can be used. The above materials are impermeable to oxygen, hydrogen, and water. With the use of such a material for the insulating film 119, it is possible to inhibit diffusion of oxygen released from at least one of the insulating films 107 and 115 to the outside, and at the same time, entry of hydrogen, water, or the like from the outside into the semiconductor film 109 or the like.

A film releasing oxygen, which is similar to the insulating films 107 and 115, may be provided between the conductive film 111, insulating film 115 or conductive film 113 and the insulating film 119. In the case where a component such as a wiring is provided over the insulating film 119, an insulating film serving as a planarization layer may be provided over the insulating film 119.

The above is the descriptions of the components.

The channel length of the transistor 100a can be controlled by controlling the distance between the conductive film 111 and the conductive film 112. That is, the layout of the first gate electrode 103 and the second gate electrode 117 can be designed with a margin, and a variation in the channel length among the transistors 100a can be reduced. Thus, a variation in the characteristics among the transistors 100 can be reduced.

Next, a method for manufacturing the multi-gate transistor 100 will be described with reference to FIGS. 3A to 3E. Each of FIGS. 3A to 3E is a schematic cross-sectional view of a step in the manufacturing process of the multi-gate transistor 100.

<Formation of Second Gate Electrode>

First, a conductive film to be the gate electrode 103 is formed over the substrate 101. After that, a resist mask is formed over the conductive film by photolithography or the like, an unnecessary portion of the conductive film is removed by etching, and then the resist mask is removed. In this manner, the gate electrode 103 can be formed.

The conductive film to be the gate electrode 103 can be formed by a sputtering method, an evaporation method, a chemical vapor deposition (CVD) method, or the like.

An insulating film to be a barrier layer may be formed over the substrate 101 before the conductive film to be the gate electrode 103 is formed.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme ultra-violet light, X-rays, or an electron beam because extremely minute processing can be performed. In the case where exposure by scanning of a beam such as an electron beam is performed, a photomask is not needed.

Subsequently, an insulating film to be the insulating film 105 is formed. It is preferable that the insulating film be formed thicker than the gate electrode 103, because chemical mechanical polishing (CMP) treatment is performed after that until a surface of the insulating film 105 is etched to substantially the same level as the top surface of the gate electrode 103.

Then, planarization treatment with the use of CMP method or the like is performed on the insulating film so that the top surface of the gate electrode 103 is exposed. In this manner, the insulating film 105 can be formed.

The insulating film to be the insulating film 105 can be formed by a sputtering method, a chemical vapor deposition (CVD) method, a molecular beam epitaxy (MBE) method, an atomic layer deposition (ALD) method, a pulsed laser deposition (PLD) method, or the like.

In order to make the insulating film 105 excessively contain oxygen, the insulating film to be the insulating film 105 may be formed in an oxygen atmosphere, for example. Alternatively, the insulating film 105 may excessively contain oxygen in such a manner that oxygen is introduced into the insulating film 105 which has been formed. Both the methods may be combined.

For example, oxygen (at least including any of oxygen radicals, oxygen atoms, and oxygen ions) is introduced into the insulating film which has been deposited, whereby a region excessively containing oxygen is formed. Oxygen can be introduced by an ion implantation method, an ion doping method, a plasma immersion ion implantation method, plasma treatment, or the like.

A gas containing oxygen can be used for treatment for introducing oxygen. As the gas containing oxygen, oxygen, dinitrogen monoxide, nitrogen dioxide, carbon dioxide, carbon monoxide, and the like can be used. A dilution gas such as a rare gas may be contained in the gas containing oxygen in the treatment for introducing oxygen.

<Formation of Insulating Film 107>

Figure 3A:
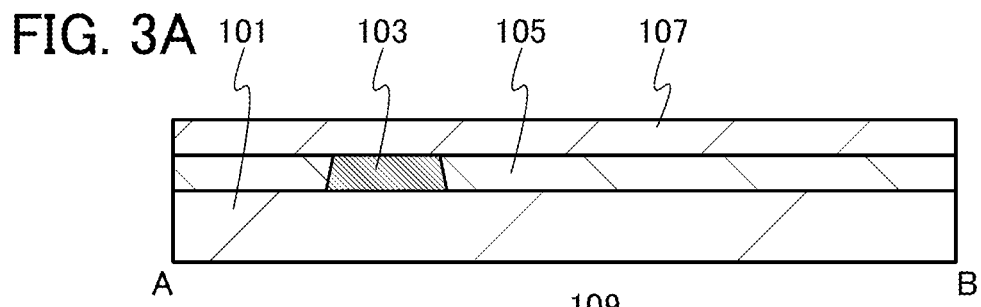
FIGS. 3A to 3E illustrate a manufacturing method of a semiconductor device of an embodiment.

Next, the insulating film 107 is formed (see FIG. 3A). The insulating film 107 can be formed by a sputtering method, a CVD method, an MBE method, an ALD method, a PLD method, or the like.

The insulating film 107 is preferably made to contain excess oxygen in the manner similar to the above-described method for the insulating film 105.

<Formation of Semiconductor Film 109>

Figure 3B:
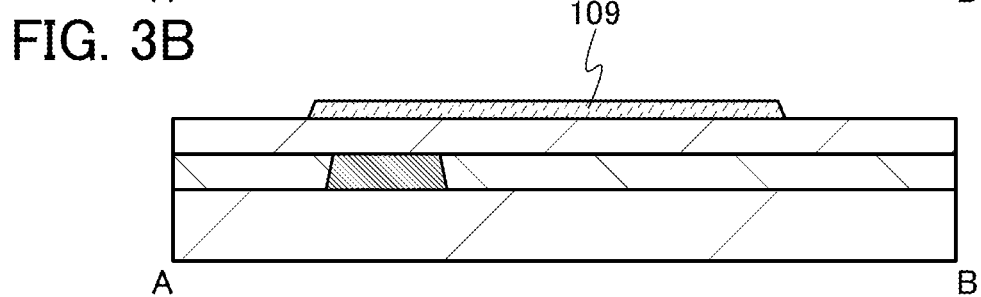

Subsequently, a semiconductor film to be the semiconductor film 109 is formed over the insulating film 107. After that, a resist mask is formed over the semiconductor film by photolithography or the like, an unnecessary portion of the semiconductor film is removed by etching, and then the resist mask is removed. In this manner, the island-shaped semiconductor film 109 can be formed (FIG. 3B).

The semiconductor film can be formed by a sputtering method, a CVD method, an MBE method, an ALD method, a PLD method, or the like. Alternatively, a technique for formation of a thin film using a liquid material, such as a sol-gel method, a spray method, or a mist method, can be used. The semiconductor film is preferably formed by a sputtering method. As a sputtering method, an RF sputtering method, a DC sputtering method, an AC sputtering method, or the like can be used. In particular, a DC sputtering method is preferably used because dust generated in the film formation can be reduced and the film thickness can be uniform.

Heat treatment may be performed after the formation of the semiconductor film. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidization gas at 10 ppm or more, in order to compensate desorbed oxygen. By the heat treatment, oxygen is supplied from the insulating films 105 and 107 to the semiconductor film, which enables reduction in oxygen vacancies in the oxide semiconductor included in the semiconductor film 109. Note that the heat treatment may be performed directly after the formation of the semiconductor film or may be performed after the semiconductor film is processed into the island-shaped semiconductor film 109.

An organic resin film having a function of improving adhesion between the film to be processed (here, the semiconductor film) and the resist film may be formed before the resist film to be the resist mask is formed. The organic resin film can be formed by a spin coating method or the like, for example, to cover the unevenness thereunder, thereby reducing variations in thickness of the resist mask to be provided over the organic resin film. In a particularly minute process, the organic resin film is preferably formed using a material functioning as an anti-reflection film against light for exposure. Examples of such an organic resin film serving as an anti-reflection film include a bottom anti-reflection coating (BARC) film. The organic resin film may be removed at the same time as the removal of the resist mask or after the resist mask is removed.

<Formation of Conductive Films 111, 112, and 113>

Figure 3C:
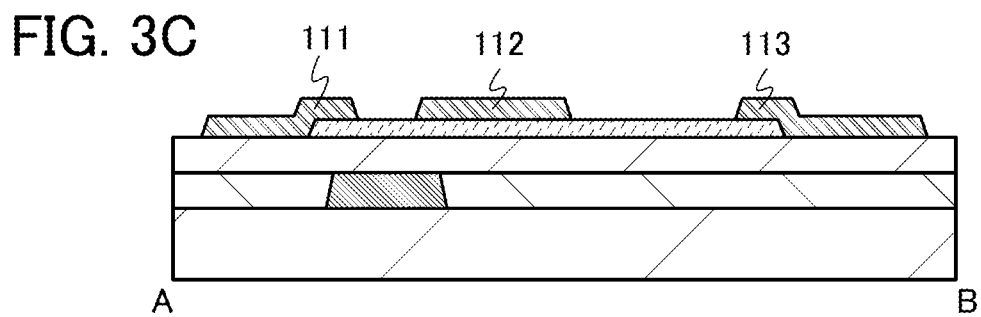

Subsequently, a conductive film to be the conductive films 111, 112, and 113 is formed over the insulating film 107 and the semiconductor film 109. After that, a resist mask is formed over the conductive film by photolithography or the like, an unnecessary portion of the conductive film is removed by etching, and then the resist mask is removed. In this manner, the conductive films 111, 112, and 113 can be formed (FIG. 3C).

The conductive film to be the conductive films 111, 112, and 113 can be formed by a sputtering method, an evaporation method, a CVD method, or the like, for example.

Here, in some cases, part of the upper portion of the semiconductor film 109 is etched when the conductive film to be the conductive films 111, 112, and 113 is etched, and the thicknesses of such portions of the semiconductor film 109 that do not overlap with the conductive film 111, 112, or 113 are reduced. For this reason, the semiconductor film to be the semiconductor film 109 is preferably formed to have a large thickness in consideration of the etching depth.

<Formation of Insulating Film 115 and Gate Electrode 117>

Subsequently, an insulating film to be the insulating film 115 is formed over the insulating film 107, the semiconductor film 109, and the conductive films 111, 112, and 113. Then, a conductive film to be the gate electrode 117 is formed over the insulating film.

The insulating film to be the insulating film 115 can be formed by a sputtering method, a CVD method, an MBE method, an ALD method, a PLD method, or the like. In particular, it is preferable that the insulating film be formed by a CVD method, more preferably a plasma CVD method, because coverage can be further improved.

The conductive film to be the gate electrode 117 can be formed by a sputtering method, an evaporation method, a CVD method, or the like.

Figure 3D:
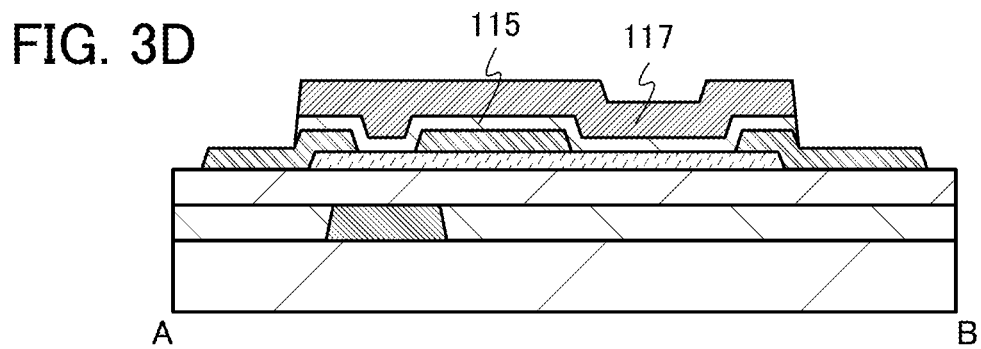

Subsequently, a resist mask is formed over the conductive film by a photolithography method or the like. Then, unnecessary portions of the conductive film and the insulating film are etched in this order, and the resist mask is removed. In this manner, the insulating film 115 and the gate electrode 117 can be formed (FIG. 3D).

The resist mask may be removed after the gate electrode 117 is formed by etching the conductive film, and the insulating film 115 may be formed with the use of the gate electrode 117 as a hard mask.

<Formation of Insulating Film 119>

Figure 3E:
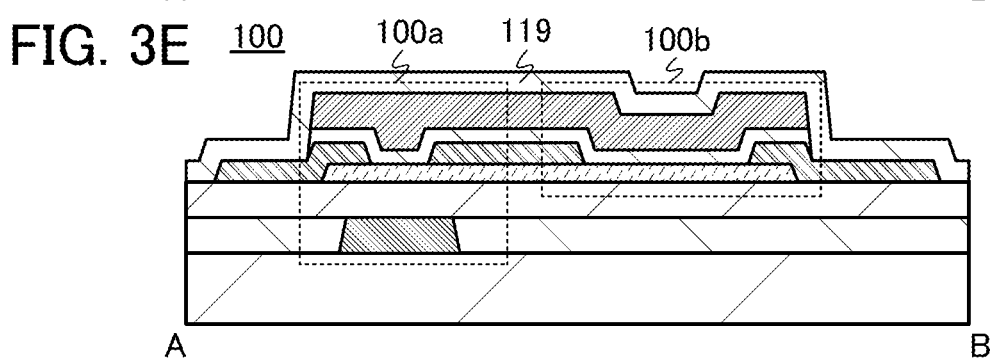

Subsequently, the insulating film 119 is formed over the insulating film 107, the conductive films 111, 112, and 113, the insulating film 115, and the gate electrode 117 (FIG. 3E).

The insulating film 119 can be formed by a sputtering method, a CVD method, an MBE method, an ALD method, a PLD method, or the like. In particular, it is preferable that the insulating film 119 be formed by a CVD method, more preferably a plasma CVD method, because coverage can be favorable.

Through the above steps, the multi-gate transistor 100 can be formed.

<Heat Treatment>

Heat treatment may be performed after the insulating film 119 is formed. Through the heat treatment, oxygen can be supplied from one or more of the insulating films 105, 107, and 115 to the semiconductor film 109 to reduce oxygen vacancies in the semiconductor film 109. At this time, since the insulating films 105, 107, and 115 are formed on an inner side than the insulating film 119, oxygen released from one or more of the insulating films 105, 107, and 115 and the semiconductor film 109 is effectively blocked, and the oxygen is prevented from being released to the outside. Consequently, the amount of oxygen that is released from one or more of the insulating films 105, 107, and 115 and that can be supplied to the semiconductor film 109 can be increased, which can efficiently reduce oxygen vacancies in the semiconductor film 109.

Through the above steps, the multi-gate transistor 100 can be manufactured.

Next, structural examples of a transistor partly different in structure from the transistor 100 will be described. Note that description of the portions already described is omitted and only different portions will be described in detail.

Modification Example 1

In FIGS. 2A to 2D, the gate electrode 117, which is shared by the transistors 100a and 100b in the multi-gate transistor 100, is formed over the semiconductor film 109, and the gate electrode 103 formed in the transistor 100 is provided between the semiconductor film 109 and the substrate 101. However, the gate electrode 117 may be provided between the semiconductor film 109 and the substrate 101, and the gate electrode 103 may be provided over the semiconductor film 109. Even with such a structure, the transistor 100 still has a multi-gate structure, so that the threshold voltage can be increased (shifted in the positive direction). Furthermore, concentration of electric field around the drain can be relaxed, which leads to an improvement in withstand voltage between the source and the drain (also referred to as drain withstand voltage).

This modification example may be used in this embodiment, the other embodiments, and modification examples thereof as appropriate.

Modification Example 2

Figure 4A:
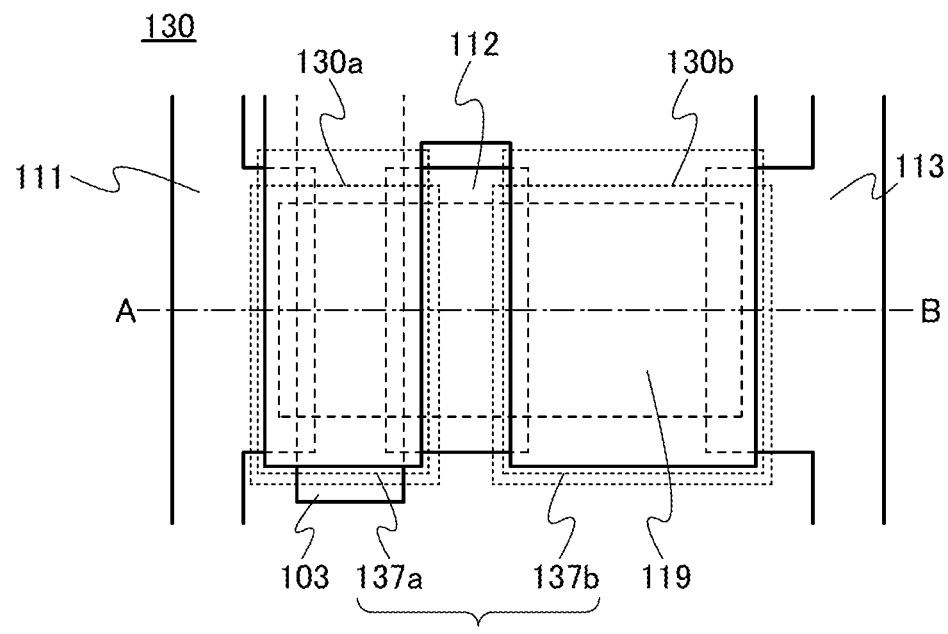
FIGS. 4A and 4B illustrate a semiconductor device of an embodiment.

The structure of a multi-gate transistor 130 will be described with reference to FIGS. 4A and 4B. FIG. 4A is a schematic top view of the multi-gate transistor 130.

Figure 4B:
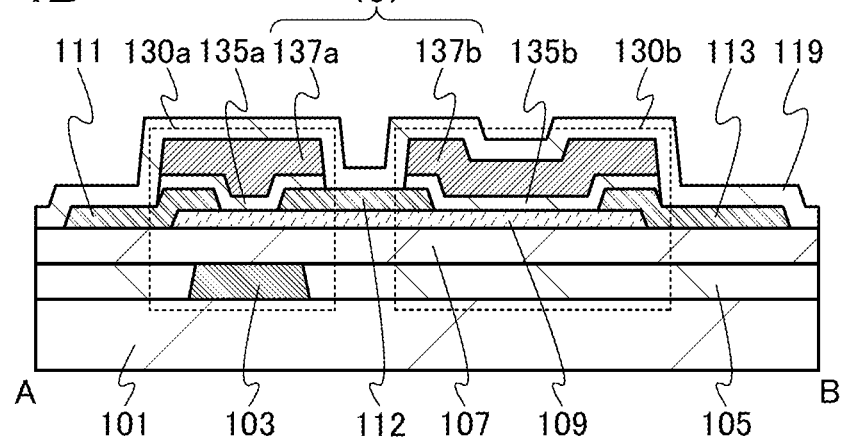

FIG. 4B is a schematic cross-sectional view taken along line A-B in FIG. 4A. Note that some components are not illustrated in FIG. 4A for simplicity.

In the transistor 130 shown in FIGS. 4A and 4B, a dual-gate transistor 130a and a single-gate transistor 130b are connected in series.

The transistor 130a has an insulating film 135 over conductive films 111 and 112, and a gate electrode 137 over the insulating film 135.

The transistor 130b has the insulating film 135 over the conductive film 112 and a conductive film 113, and the gate electrode 137 over the insulating film 135.

The insulating film 135 and the gate electrode 137 can be formed using materials similar to those of the insulating film 115 and the gate electrode 117 of the transistor 100, respectively.

Note that the insulating film 135 has a first region 135a and a second region 135b, which are separated from each other over the semiconductor film 109. The gate electrode 137 has a first region 137a and a second region 137b, which are separated from each other over the semiconductor film 109. That is, the gate electrode 137 is separated over the conductive film 112. Therefore, an area where the conductive film 112 and the gate electrode 137 overlap with each other is reduced, which decreases parasitic capacitance formed between the conductive film 112 and the gate electrode 137. As a result, the multi-gate transistor 130 can operate at high speed. In addition, the transistor 130 having a multi-gate structure can shift the threshold voltage in the positive direction. Furthermore, concentration of electric field around the drain can be relaxed, which leads to an improvement in withstand voltage between the source and the drain (also referred to as drain withstand voltage).

This modification example may be used in this embodiment, the other embodiments, and modification examples thereof as appropriate.

Modification Example 3

Figure 5A:
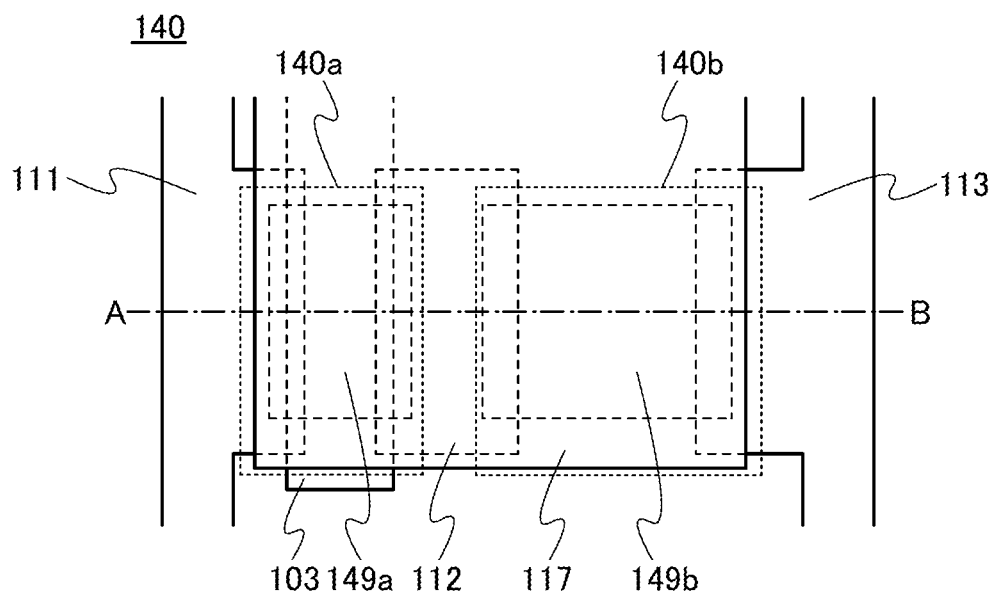
FIGS. 5A and 5B illustrate a semiconductor device of an embodiment.
Figure 5B:
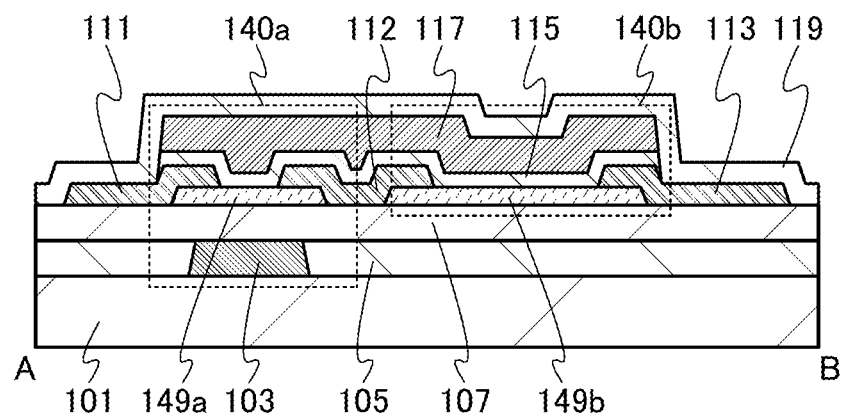

The structure of a multi-gate transistor 140 will be described with reference to FIGS. 5A and 5B. FIG. 5A is a schematic top view of the multi-gate transistor 140. FIG. 5B is a schematic cross-sectional view taken along line A-B in FIG. 5A. Note that some components are not illustrated in FIG. 5A for simplicity.

In the transistor 140 shown in FIGS. 5A and 5B, a dual-gate transistor 140a and a single-gate transistor 140b are connected in series.

The transistor 140a has a semiconductor film 149a between an insulating film 107 and an insulating film 115.

The transistor 140b has a semiconductor film 149b between the insulating film 107 and the insulating film 115.

The semiconductor films 149a and 149b can be formed using a material similar to that of the semiconductor film 109 of the transistor 100.

The semiconductor film 149a and the semiconductor film 149b are separated from each other. A conductive film 112 is in contact with each of the semiconductor film 149a and the semiconductor film 149b, whereby the transistor 140a and the transistor 140b are connected in series. The transistor 140 having a multi-gate structure can shift the threshold voltage in the positive direction. Furthermore, concentration of electric field around the drain can be relaxed, which leads to an improvement in withstand voltage between the source and the drain (also referred to as drain withstand voltage).

This modification example may be used in this embodiment, the other embodiments, and modification examples thereof as appropriate.

Modification Example 4

Figure 6A:
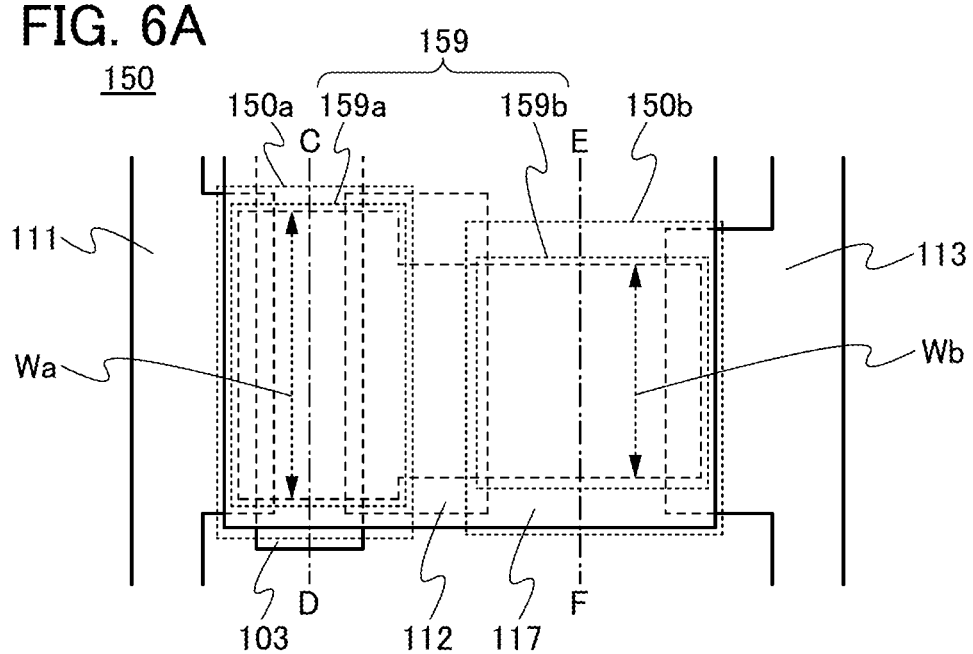
FIGS. 6A to 6C illustrate a semiconductor device of an embodiment.
Figure 6B:
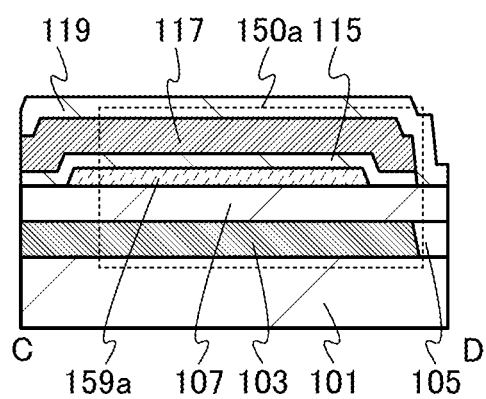
Figure 6C:
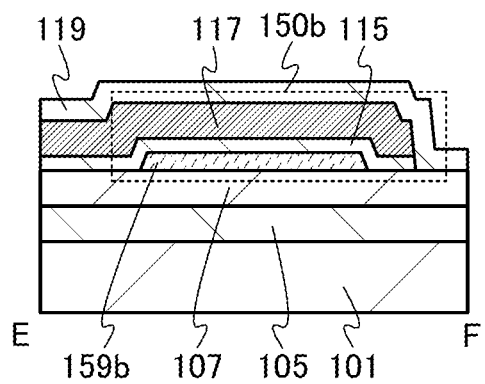

The structure of a multi-gate transistor 150 will be described with reference to FIGS. 6A to 6C. FIG. 6A is a schematic top view of the multi-gate transistor 150. FIG. 6B is a schematic cross-sectional view taken along line C-D in FIG. 6A, and FIG. 6C is a schematic cross-sectional view taken along line E-F in FIG. 6A. Note that some components are not illustrated in FIG. 6A for simplicity.

In the transistor 150 shown in FIGS. 6A to 6C, a dual-gate transistor 150a and a single-gate transistor 150b are connected in series.

The transistor 150a has a first region 159a of a semiconductor film 159 between an insulating film 107 and an insulating film 115.

The transistor 150b has a second region 159b of the semiconductor film 159 between the insulating film 107 and the insulating film 115.

The semiconductor film 159 can be formed using a material similar to that of the semiconductor film 109 of the transistor 100.

The first region 159a and the second region 159b are different from each other in length in the channel width direction. Specifically, the length of the first region 159a in the channel width direction is greater than that of the second region 159b in the channel width direction. In other words, the channel width Wa of the transistor 150a is greater than the channel width Wb of the transistor 150b. By making the channel width Wa of the transistor 150a greater than one time and less than 10 times the channel width Wb of the transistor 150b, preferably greater than one time and less than three times the channel width Wb of the transistor 150b, the on-state current of the transistor 150a can be increased. As a result, the threshold voltage of the multi-gate transistor 150 can be increased (shifted in the positive direction), and at the same time, the on-state current can rise sharply in a subthreshold region of the $I_d$-$V_g$ characteristics of the transistor.

This modification example may be used in this embodiment, the other embodiments, and modification examples thereof as appropriate.

Modification Example 5

In the semiconductor device of one embodiment of the present invention, another oxide semiconductor film is preferably provided between the oxide semiconductor film to be the semiconductor film 109 and the insulating film overlapping with the oxide semiconductor film, and such another oxide semiconductor film contains as its constituent element at least one of the metal elements that constitute the oxide semiconductor film to be the semiconductor film 109. With such a structure, formation of a trap level at the interface between the oxide semiconductor film and the insulating film overlapping with the oxide semiconductor film can be suppressed.

That is, one embodiment of the present invention preferably has a structure in which each of the top surface and the bottom surface of at least the channel formation region of the oxide semiconductor film is in contact with the oxide semiconductor film that functions as a barrier film for preventing formation of an interface state of the oxide semiconductor film. With this structure, formation of oxygen vacancies and entry of impurities which cause formation of carriers in the oxide semiconductor film and the interface can be prevented. Thus, a highly purified intrinsic oxide semiconductor film can be obtained. Obtaining a highly purified intrinsic oxide semiconductor film refers to purifying or substantially purifying the oxide semiconductor film to be an intrinsic or substantially intrinsic oxide semiconductor film. In this way, a change in electrical characteristics of a transistor including the oxide semiconductor film can be prevented, and a highly reliable semiconductor device can be provided.

Note that in this specification and the like, the carrier density of a substantially purified oxide semiconductor film is lower than $1\times10^{17}/cm^3$, lower than $1\times10^{15}/cm^3$, or lower than $1\times10^{13}/cm^3$. With a highly purified intrinsic oxide semiconductor film, the transistor can have stable electric characteristics.

More specifically, the following structures can be employed, for example.

Figure 7A:
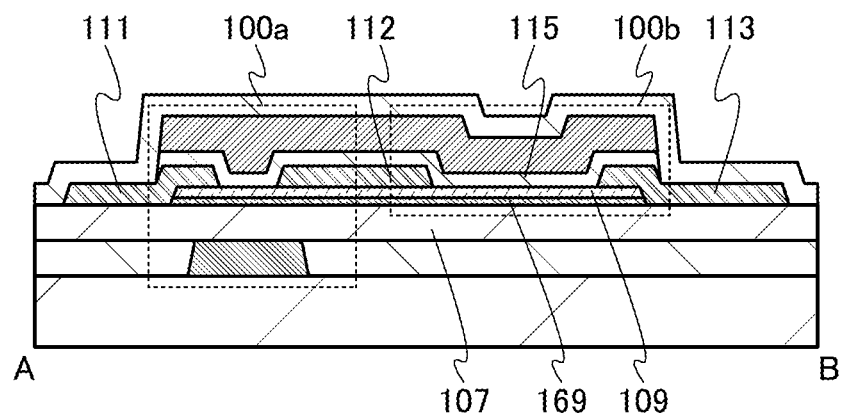
FIGS. 7A and 7B illustrate a semiconductor device of an embodiment.
Figure 7B:
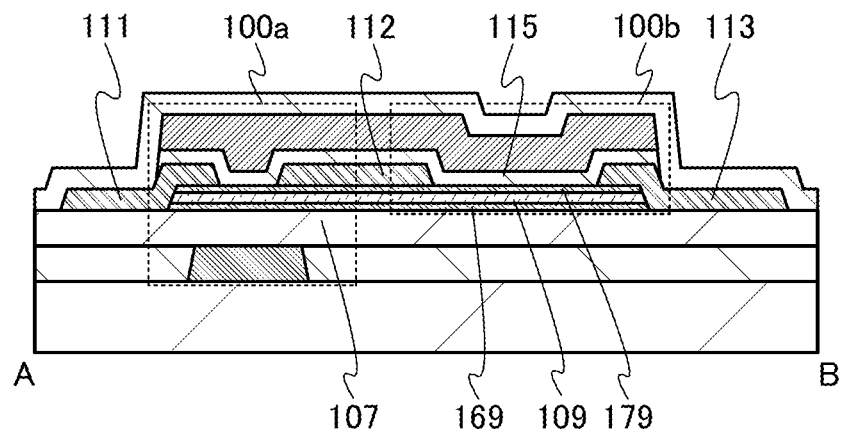

FIGS. 7A and 7B each are a schematic cross-sectional view of a transistor described as an example below. Note that FIG. 2A can be referred to for the schematic top view.

A transistor shown in FIG. 7A has an oxide semiconductor film 169 between an insulating film 107 and a semiconductor film 109.

A transistor shown in FIG. 7B has an oxide semiconductor film 169 between an insulating film 107 and a semiconductor film 109, and an oxide semiconductor film 179 between the semiconductor film 109 and an insulating film 115.

Each of the oxide semiconductor films 169 and 179 is formed of a metal oxide containing one or more kinds of metal elements that are also contained in the semiconductor film 109.

Note that the boundary between the semiconductor film 109 and the oxide semiconductor film 169 or the boundary between the semiconductor film 109 and the oxide semiconductor film 179 is not clear in some cases.

For example, the oxide semiconductor films 169 and 179 contain In or Ga; typically, a material such as an In—Ga-based oxide, an In—Zn-based oxide, or an In-M-Zn-based oxide (M is Al, Ti, Ga, Y, Zr, La, Ce, Nd, or Hf) that has energy at the bottom of the conduction band closer to the vacuum level than that of the semiconductor film 109 is used. Typically, the difference in energy at the bottom of the conduction band between the oxide semiconductor film 169 or 179 and the semiconductor film 109 is preferably 0.05 eV or more, 0.07 eV or more, 0.1 eV or more, or 0.15 eV or more and 2 eV or less, 1 eV or less, 0.5 eV or less, or 0.4 eV or less.

For each of the oxide semiconductor films 169 and 179 between which the semiconductor film 109 is sandwiched, an oxide that contains a larger amount of Ga serving as a stabilizer than that of the semiconductor film 109 is used, which can suppress release of oxygen from the semiconductor film 109.

When an In—Ga—Zn-based oxide in which the atomic ratio of In to Ga and Zn is 1:1:1 or 3:1:2 is used for the semiconductor film 109, for example, an In—Ga—Zn-based oxide in which the atomic ratio of In to Ga and Zn is 1:3:2, 1:3:4, 1:3:6, 1:6:4, 1:6:8, 1:6:10, or 1:9:6 can be used for the oxide semiconductor films 169 and 179. Note that the proportion of each metal element in the atomic ratio of each of the semiconductor film 109 and the oxide semiconductor films 169 and 179 varies within a range of ±40% of that in the above atomic ratio as an error. For the oxide semiconductor films 169 and 179, materials with the same composition ratio or materials with different composition ratios may be used.

Further, when an In-M-Zn-based oxide is used for the semiconductor film 109, a metal oxide containing metal elements in the atomic ratio satisfying the following conditions is preferably used for a target for forming the film to be the semiconductor film 109. Given that the atomic ratio of the metal elements in the metal oxide is $In:M:Zn=x_1:y_1:z_1$, $x_1/y_1$ is greater than or equal to ⅓ and less than or equal to 6, preferably greater than or equal to 1 and less than or equal to 6, and $z_1/y_1$ is greater than or equal to ⅓ and less than or equal to 6, preferably greater than or equal to 1 and less than or equal to 6. Note that when $z_1/y_1$ is less than or equal to 6, a CAAC-OS film to be described later is easily formed. Typical examples of the atomic ratio of the metal elements in the target are In:M:Zn=1:1:1, In:M:Zn=3:1:2, or the like.

When an In-M-Zn-based oxide is used for the oxide semiconductor films 169 and 179, an oxide containing metal elements in the atomic ratio satisfying the following conditions is preferably used for a target for forming the films to be the oxide semiconductor films 169 and 179. Given that the atomic ratio of the metal elements in the oxide is $In:M:Zn=x_2:y_2:z_2$, $x_2/y_2$ is less than $x_1/y_1$, and $z_2/y_2$ is greater than or equal to ⅓ and less than or equal to 6, preferably greater than or equal to 1 and less than or equal to 6. Note that when $z_2/y_2$ is less than or equal to 6, a CAAC-OS film to be described later is easily formed. Typical examples of the atomic ratio of the metal elements in the target are In:M:Zn=1:3:4, In:M:Zn=1:3:6, In:M:Zn=1:3:8, or the like.

By using a material in which the energy at the bottom of the conduction band is closer to the vacuum level than that of the semiconductor film 109 is for the oxide semiconductor films 169 and 179, a channel is mainly formed in the semiconductor film 109, so that the semiconductor film 109 serves as a main current path. When the semiconductor film 109 in which a channel is formed is sandwiched between the oxide semiconductor films 169 and 179 as described above, formation of interface states between these films is suppressed, and thus reliability of the electrical characteristics of the transistor is improved.

Note that, without limitation to that described above, a material with an appropriate composition may be used depending on required semiconductor characteristics and electrical characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor film 109 and the oxide semiconductor films 169 and 179 be set to appropriate values.

Here, it is preferable that the thickness of the semiconductor film 109 be at least larger than that of the oxide semiconductor film 169. The thicker the semiconductor film 109 is, the larger the on-state current of the transistor can be. The thickness of the oxide semiconductor film 169 may be set as appropriate as long as formation of an interface state at the interface with the semiconductor film 109 is inhibited. For example, the thickness of the semiconductor film 109 is larger than that of the oxide semiconductor film 169, preferably 2 times or more, further preferably 4 times or more, still further preferably 6 times or more as large as that of the oxide semiconductor film 169. Note that the above does not apply in the case where the on-state current of the transistor need not be increased, and the thickness of the oxide semiconductor film 169 may be equal to or greater than that of the semiconductor film 109.

The thickness of the oxide semiconductor film 179 may be set as appropriate, in a manner similar to that of the oxide semiconductor film 169, as long as formation of an interface state at the interface with the semiconductor film 109 is inhibited. For example, the thickness of the oxide semiconductor film 179 may be set smaller than or equal to that of the oxide semiconductor film 169. If the oxide semiconductor film 179 is thick, it may become difficult for the electric field from the gate electrode 117 to reach the semiconductor film 109. Therefore, it is preferable that the oxide semiconductor film 179 be thin; for example, thinner than the semiconductor film 109. Note that the thickness of the oxide semiconductor film 179 is not limited to the above, and may be set as appropriate depending on a driving voltage of the transistor in consideration of the withstand voltage of the insulating film 115.

Here, in the case where the semiconductor film 109 is in contact with an insulating film containing different constituent elements (e.g., an insulating film containing a silicon oxide film), an interface state is sometimes formed at the interface between the two films and the interface state forms a channel. In that case, a new transistor having a different threshold voltage may be formed, and accordingly an apparent threshold voltage of the transistor may fluctuate. However, in the transistor of this structural example, the oxide semiconductor film 169 contains one or more kinds of metal elements that constitute the semiconductor film 109. Therefore, an interface state is not easily formed at the interface between the oxide semiconductor film 169 and the semiconductor film 109. Thus, providing the oxide semiconductor film 169 makes it possible to reduce variations or changes in electrical characteristics of the transistor, such as threshold voltage.

When a channel is formed at the interface between the insulating film 115 and the semiconductor film 109, interface scattering occurs at the interface and the field-effect mobility of the transistor decreases. In the transistor of this structural example, however, the oxide semiconductor film 179 contains one or more kinds of metal elements that constitute the semiconductor film 109. Therefore, scattering of carriers is less likely to occur at the interface between the semiconductor film 109 and the oxide semiconductor film 179, and thus the field-effect mobility of the transistor can be increased.

This modification example may be used in this embodiment, the other embodiments, and modification examples thereof as appropriate. In addition, this embodiment can be combined with any of the other embodiments disclosed in this specification as appropriate.

Embodiment 2

In this embodiment, a transistor which can be used as appropriate for the multi-gate transistor described in Embodiment 1 will be described with reference to FIGS. 8A to 8D.

Figure 8A:
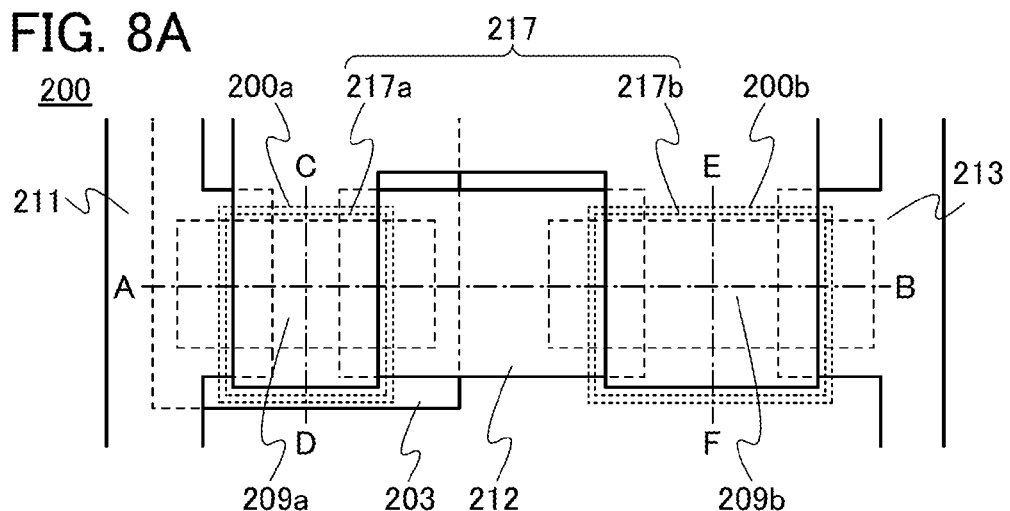
FIGS. 8A to 8D illustrate a semiconductor device of an embodiment.
Figure 8B:
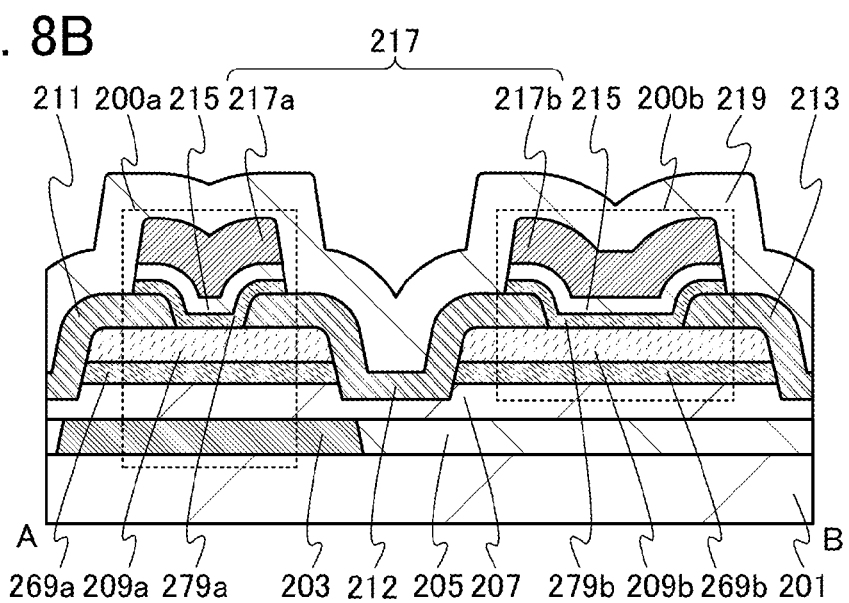
Figure 8C:
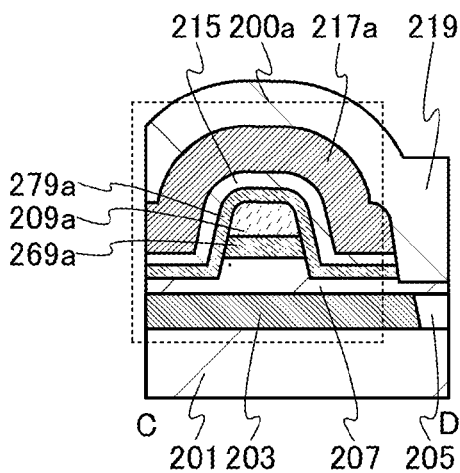
Figure 8D:
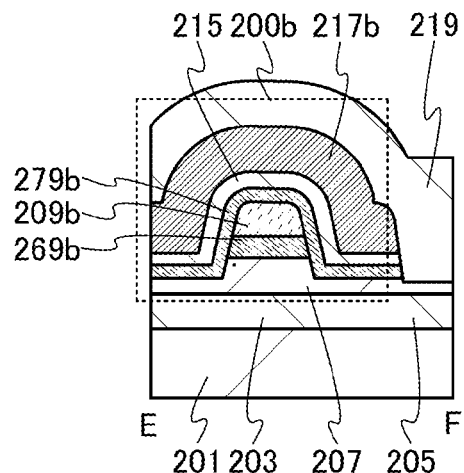

FIGS. 8A to 8D are a top view and cross-sectional views of a multi-gate transistor in a semiconductor device of one embodiment of the present invention. FIG. 8A is a top view, and FIG. 8B is a schematic cross-sectional view taken along line A-B in FIG. 8A. FIGS. 8C and 8D are schematic cross-sectional views taken along line C-D and line E-F in FIG. 8A, respectively.

In a multi-gate transistor 200, a dual-gate transistor 200a and a single-gate transistor 200b are connected in series. Specifically, in the multi-gate transistor 200, the dual-gate transistor 200a and the single-gate transistor 200b are connected in series by sharing a conductive film 212 and a gate electrode 217.

The transistor 200a includes: an island-shaped oxide semiconductor film 269a and an island-shaped oxide semiconductor film 209a over a substrate 201, a gate electrode 203 between the substrate 201 and the oxide semiconductor film 269a, an insulating film 207 in contact with the oxide semiconductor film 269a between the gate electrode 203 and the oxide semiconductor film 269a, conductive films 211 and 212 in contact with the oxide semiconductor film 209a, an oxide semiconductor film 279a in contact with the oxide semiconductor film 209a and the conductive films 211 and 212, an insulating film 215 in contact with the oxide semiconductor film 279a, and a gate electrode 217 overlapping with the oxide semiconductor film 209a with the insulating film 215 provided therebetween. Note that a first region 217a of the gate electrode 217 serves as the gate electrode of the transistor 200a.

The transistor 200b includes: an island-shaped oxide semiconductor film 269b and an island-shaped oxide semiconductor film 209b over the substrate 201, conductive films 212 and 213 in contact with the oxide semiconductor film 209b, an oxide semiconductor film 279b in contact with the oxide semiconductor film 209b and the conductive films 212 and 213, the insulating film 215 in contact with the oxide semiconductor film 279b, and the gate electrode 217 overlapping with the oxide semiconductor film 209b with the insulating film 215 provided therebetween. Note that a second region 217b of the gate electrode 217 serves as the gate electrode of the transistor 200b.

In the transistor 200a, the insulating film 207 and the insulating film 215 each serve as a gate insulating film. In the transistor 200b, the insulating film 215 serves as a gate insulating film. The insulating film 207 has projecting portions. The stacked oxide semiconductor films 269a and 209a, and the stacked oxide semiconductor films 269b and 209b, are provided over the projecting portions of the insulating film 207 in the transistors 200a and 200b, respectively.

As shown in FIG. 8B, the oxide semiconductor film 279a is in contact with the top surface of the oxide semiconductor film 209a, and the top and side surfaces of the conductive films 211 and 212. As shown in FIG. 8C, the oxide semiconductor film 279a is in contact with the top surface of the insulating film 207, the side surfaces of the projecting portions of the insulating film 207, the side surfaces of the oxide semiconductor film 269a, and the top and side surfaces of the oxide semiconductor film 209a. As shown in FIG. 8B, the oxide semiconductor film 279b is in contact with the top surface of the oxide semiconductor film 209b, and the top and side surfaces of the conductive films 212 and 213. As shown in FIG. 8D, the oxide semiconductor film 279b is in contact with the top surface of the insulating film 207, the side surfaces of the projecting portions of the insulating film 207, the side surfaces of the oxide semiconductor film 269b, and the top and side surfaces of the oxide semiconductor film 209b.

The conductive film 211 serves as a source electrode of the multi-gate transistor 200, and the conductive film 213 serves as a drain electrode of the multi-gate transistor 200.

As shown in FIG. 8C, the first region 217a of the gate electrode 217 faces the top and side surfaces of the oxide semiconductor film 209a with the insulating film 215 provided therebetween, in the channel width direction of the transistor 200a. As shown in FIG. 8D, the second region 217b of the gate electrode 217 faces the top and side surfaces of the oxide semiconductor film 209b with the insulating film 215 provided therebetween, in the channel width direction of the transistor 200b.

The first region 217a of the gate electrode 217 electrically surrounds the oxide semiconductor film 209a. The second region 217b of the gate electrode 217 electrically surrounds the oxide semiconductor film 209b. With this structure, on-state current of the transistor 200a and the transistor 200b can be increased. Such a transistor structure is referred to as a surrounded channel (s-channel) structure. Note that in the s-channel structure, current flows in the whole (bulk) of the oxide semiconductor films 209a and 209b. Since current flows in an inner part of the oxide semiconductor films 209a and 209b, the current is hardly affected by interface scattering, and high on-state current can be obtained. In addition, by making the oxide semiconductor films 209a and 209b thick, on-state current can be improved.

In fabricating a transistor with a small channel length and a small channel width, when an electrode, a semiconductor film, or the like is processed while a resist mask is reduced in size, the electrode, the semiconductor film, or the like has a round end portion (curved surface) in some cases. With this structure, the coverage with the oxide semiconductor films 279a and 279b, the insulating film 215, and the gate electrode 217, which are to be formed over the oxide semiconductor films 209a and 209b, can be improved. In addition, electric field concentration which might occur at the edges of the conductive films 211, 212, and 213 can be relaxed, which can suppress deterioration of the transistor.

In addition, by miniaturizing the transistor, higher integration and higher density can be achieved. For example, the channel length of the transistor is set to 100 nm or less, preferably 40 nm or less, more preferably 30 nm or less, still more preferably 20 nm or less, and the channel width of the transistor is set to 100 nm or less, preferably 40 nm or less, more preferably 30 nm or less, still more preferably 20 nm or less. The transistor of one embodiment of the present invention with the s-channel structure can increase on-state current even in the case where the channel width thereof is shortened as described above.

For the substrate 201, the gate electrode 203, the insulating films 205 and 207, the oxide semiconductor films 209a and 209b, the conductive films 211, 212, and 213, the insulating film 215, the gate electrode 217, and the insulating film 219; the materials and forming methods of the substrate 101, the gate electrode 103, the insulating films 105 and 107, the semiconductor film 109, the conductive films 111, 112, and 113, the insulating film 115, the gate electrode 117, and the insulating film 119 described in Embodiment 1 can be used, respectively, as appropriate.

For the oxide semiconductor films 269a and 269b, the material of the oxide semiconductor films 169a and 169b described in Embodiment 1 can be used as appropriate. Before a film to be the semiconductor film 109 in FIG. 3B, a film to be the oxide semiconductor films 269a and 269b is formed. Then, a film to be the oxide semiconductor films 269a and 269b and a film to be the semiconductor film 109 are processed, whereby the oxide semiconductor films 269a and 269b and the oxide semiconductor films 209a and 209b can be obtained.

For the oxide semiconductor films 279a and 279b, the material of the oxide semiconductor films 179a and 179b described in Embodiment 1 can be used as appropriate. Before a film to be the insulating film 115 is formed in FIG. 3D, a film to be the oxide semiconductor films 279a and 279b is formed. Then, a film to be the oxide semiconductor films 279a and 279b and a film to be the insulating film 115 are processed, whereby the oxide semiconductor films 279a and 279b and the insulating film 115 can be obtained.

High integration of a semiconductor device requires miniaturization of a transistor. However, it is known that miniaturization of a transistor causes deterioration in electrical characteristics of the transistor. A decrease in channel width causes a reduction in on-state current.

However, in the transistor of one embodiment of the present invention, as described above, the oxide semiconductor films 279a and 279b are formed to cover the channel formation region of the oxide semiconductor films 209a and 209b, and the channel formation region and the insulating film 215 serving as the gate insulating film are not in contact with each other. Therefore, scattering of carries formed at the interface between the oxide semiconductor films 209a and 209b and the gate insulating film can be suppressed, whereby on-state current of the transistor can be increased.

In the case where a semiconductor film is made intrinsic or substantially intrinsic, decrease in the number of carriers contained in the semiconductor film may reduce the field-effect mobility. However, in the transistor of one embodiment of the present invention, a gate electric field is applied to the oxide semiconductor films 209a and 209b not only in the vertical direction but also from the side surfaces. That is, the gate electric field is applied to the whole of the oxide semiconductor films 209a and 209b, whereby current flows in the bulk of the semiconductor films. It is thus possible to improve the field-effect mobility of the transistor while a change in electrical characteristics is reduced by highly purified intrinsic properties.

In the transistor of one embodiment of the present invention, the oxide semiconductor films 209a and 209b are formed over the oxide semiconductor films 269a and 269b, so that an interface state is less likely to be formed. In addition, impurities do not enter the oxide semiconductor films 209a and 209b from above and below because the oxide semiconductor films 209a and 209b are provided between two oxide semiconductor films. Thus, the oxide semiconductor films 209a and 209b are surrounded by the oxide semiconductor films 269a and 269b and the oxide semiconductor films 279a and 279b (also electrically surrounded by the gate electrode 217), so that stabilization of the threshold voltage in addition to the above-described improvement of on-state current of the transistor is possible. Furthermore, with the multi-gate structure, the threshold voltage can be shifted in the positive direction. As a result, current flowing between the source and the drain when the voltage of the gate electrode is 0 V can be reduced, which leads to lower power consumption. Further, the threshold voltage of the transistor becomes stable; thus, long-term reliability of the semiconductor device can be improved.

Modification Example 1

Although the insulating film 207 has projecting portions in FIGS. 8A to 8D, it need not necessarily have projecting portions. That is, by setting the etching selectivity ratio of the oxide semiconductor films 269a, 269b, 209a, and 209b with respect to the insulating film 207 high, overetching of the insulating film 207 can be prevented. With such a structure, on-state current of the transistor can still be increased. In addition, with the multi-gate structure, the threshold voltage can be shifted in the positive direction.

This modification example may be used in this embodiment, the other embodiments, and modification examples thereof as appropriate.

Modification Example 2

In FIGS. 8A to 8D, without providing the oxide semiconductor films 269a and 269b and the oxide semiconductor films 279a and 279b, the oxide semiconductor films 209a and 209b may be formed over the insulating film 207, and the insulating film 215 may be formed over the oxide semiconductor films 209a and 209b. Even with such a structure, on-state current of the transistor can be increased. In addition, with the multi-gate structure, the threshold voltage can be shifted in the positive direction.

This modification example may be used in this embodiment, the other embodiments, and modification examples thereof as appropriate.

Modification Example 3

In FIGS. 8A to 8D, without providing the oxide semiconductor films 269a and 269b, the oxide semiconductor films 209a and 209b may be formed over the insulating film 207 and the oxide semiconductor films 279a and 279b may be formed over the oxide semiconductor films 209a and 209b. Even with such a structure, on-state current of the transistor can be increased. In addition, with the multi-gate structure, the threshold voltage can be shifted in the positive direction.

This modification example may be used in this embodiment, the other embodiments, and modification examples thereof as appropriate.

Modification Example 4

In FIGS. 8A to 8D, without providing the oxide semiconductor films 279a and 279b, the oxide semiconductor films 269a and 269b may be formed on the insulating film 207, the oxide semiconductor films 209a and 209b may be formed on the oxide semiconductor films 269a and 269b, and the insulating film 215 may be formed on the oxide semiconductor films 209a and 209b. Even with such a structure, on-state current of the transistor can be increased. In addition, with the multi-gate structure, the threshold voltage can be shifted in the positive direction.

This modification example may be used in this embodiment, the other embodiments, and modification examples thereof as appropriate. Furthermore, this embodiment can be combined with any of the other embodiments disclosed in this specification as appropriate.

Embodiment 3

In this embodiment, a structural example of a transistor partly different in structure from the multi-gate transistor described in Embodiment 1 or Embodiment 2 as an example will be described with reference to the drawings. Note that description of the portions already described is omitted and only different portions are described in detail. Even when positions and shapes of components are different from those described above, the same reference numerals are used as

Structural Example 1

Figure 9A:
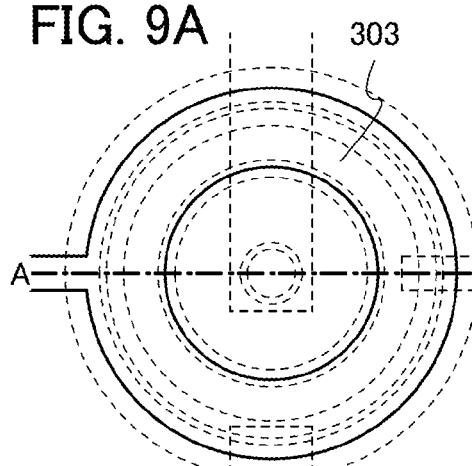
FIGS. 9A to 9E illustrate a semiconductor device of an embodiment.
Figure 9B:
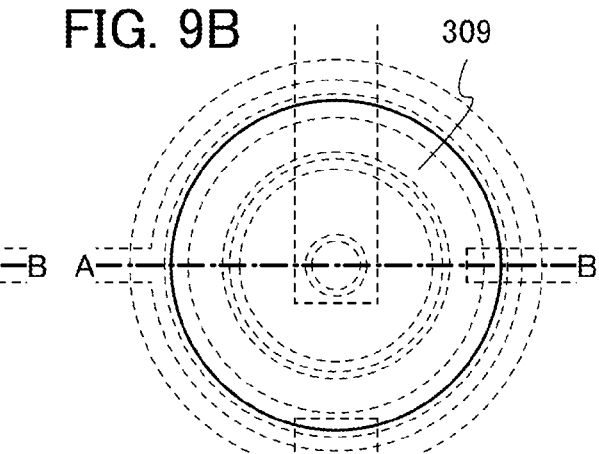
Figure 9C:
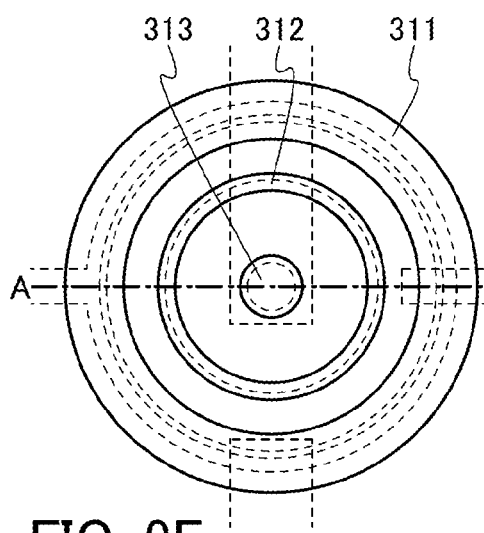
Figure 9D:
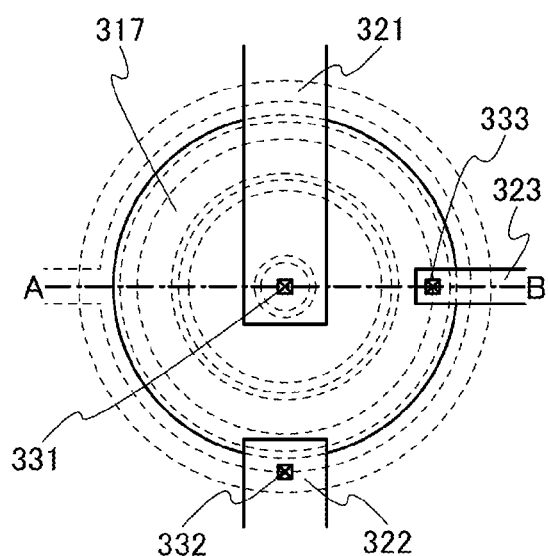
Figure 9E:
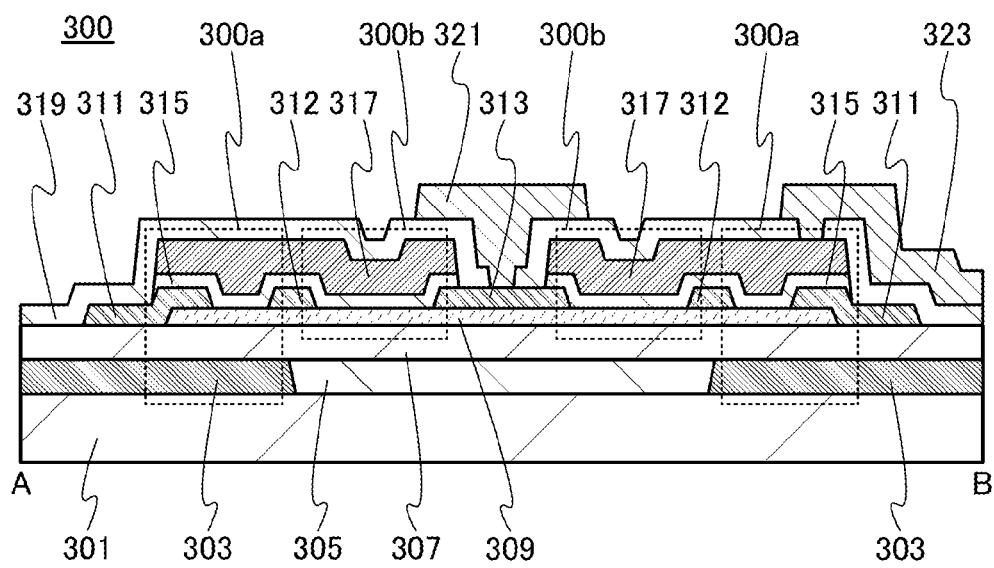

FIGS. 9A to 9D are schematic top views of a transistor 300 of this structural example. FIG. 9E is a schematic cross-sectional view taken along line A-B in FIGS. 9A to 9D, when all the films are stacked. FIG. 9A is a schematic top view of a gate electrode 303, FIG. 9B is a schematic top view of a semiconductor film 309, FIG. 9C is a schematic top view of conductive films 311, 312, and 313, and FIG. 9D is a schematic top view of a gate electrode 317 and wirings 321, 322, and 323.

The transistor 300 is different from the transistors described in Embodiment 1 and Embodiment 2, in that the top-view shape of each of the gate electrodes is a ring and the top-view shape of the semiconductor film is a circle.

As shown in FIG. 9A, the top-view shape of the gate electrode 303 is a ring having an opening. Part of the gate electrode 303 is led to the outside of the conductive film 311, as viewed from the top.

As shown in FIG. 9B, the top-view shape of the island-shaped semiconductor film 309 is a circle overlapping with part of the gate electrode 303.

As shown in FIG. 9C, the top-view shape of the conductive film 311 is a ring overlapping with part of the gate electrode 303 and part of the semiconductor film 309. The conductive film 312 is on an inner side than the conductive film 311, and the top-view shape thereof is a ring overlapping with part of the semiconductor film 309. The conductive film 313 is on an inner side than the conductive film 312, and the top-view shape thereof is a circle overlapping with part of the semiconductor film 309.

As shown in FIG. 9D, the top-view shape of the gate electrode 317 is a ring having an opening, overlapping with part of the gate electrode 303, part of the semiconductor film 309, part of the conductive films 311 and 313, and the conductive film 312. A wiring 321 is connected to the conductive film 313 in an opening 331 that is provided in the opening of the gate electrode 317. A wiring 322 is connected to the conductive film 311 in an opening 332, and a wiring 323 is connected to the gate electrode 317 in an opening 333.

As shown in FIG. 9E, in the multi-gate transistor 300, a dual-gate transistor 300a and a single-gate transistor 300b are connected in series. Specifically, in the multi-gate transistor 300, the dual-gate transistor 300a and the single-gate transistor 300b are connected in series by sharing the semiconductor film 309, the conductive film 312, and the gate electrode 317.

The transistor 300a includes: the island-shaped semiconductor film 309 over a substrate 301, the gate electrode 303 between the substrate 301 and the semiconductor film 309, an insulating film 307 in contact with the semiconductor film 309 between the gate electrode 303 and the semiconductor film 309, the conductive films 311 and 312 in contact with the semiconductor film 309, an insulating film 315 in contact with the semiconductor film 309, and the gate electrode 317 overlapping with the semiconductor film 309 with the insulating film 315 provided therebtween.

The insulating film 307 and the insulating film 315 each serve as a gate insulating film of the transistor 300a.

The transistor 300b includes: the island-shaped semiconductor film 309 in contact with the insulating film 307, the conductive films 312 and 313 in contact with the semiconductor film 309, the insulating film 315 in contact with the semiconductor film 309, and the gate electrode 317 overlapping with the semiconductor film 309 with the insulating film 315 provided therebetween.

The insulating film 315 serves as a gate insulating film of the transistor 300b.

For the substrate 301, the gate electrode 303, the insulating films 305 and 307, the semiconductor film 309, the conductive films 311, 312, and 313, the insulating film 315, the gate electrode 317, and the insulating film 319; the materials and forming methods of the substrate 101, the gate electrode 103, insulating films 105 and 107, the semiconductor film 109, the conductive films 111, 112, and 113, the insulating film 115, the gate electrode 117, and the insulating film 119 described in Embodiment 1 can be used, respectively, as appropriate.

For the wirings 321, 322, and 323, materials similar to those of the conductive films 311, 312, and 313 can be used as appropriate. A film to be the wirings 321, 322, and 323 is formed over the insulating film 319 after openings in the insulating film 319 are formed. Then, the film to be the wirings 321, 322, and 323 are processed, whereby the wirings 321, 322, and 323 can be formed.

In this manner, the conductive film 312 is provided on an inner side than the conductive film 311, and the conductive film 313 is provided on an inner side than the conductive film 312, whereby the channel width with respect to the area occupied by the multi-gate transistor 300 can be large as compared to the case where these conductive films are placed in parallel. Thus, larger drain current can be obtained. This structure can be favorably used in a high-voltage device for high-power application.

Furthermore, the top-view shapes of the semiconductor film 309 and the conductive film 313 are circles, and the top-view shapes of the conductive films 312 and 311 are rings surrounding the semiconductor film 309 and the conductive film 313, whereby the channel length L can be uniform in the circumference direction. The top-view shape of the semiconductor film 309 is not limited thereto, and can be a polygonal shape including a square shape and a rectangular shape, an elliptical shape, or a polygonal shape with round corners. Since the transistor 300 has a multi-gate structure, the threshold voltage can be shifted in the positive direction. Furthermore, concentration of electric field around the drain can be relaxed, which leads to an improvement in withstand voltage between the source and the drain (also referred to as drain withstand voltage).

Modification Example 1

Although in FIGS. 9A to 9E the gate electrode 303 overlaps with the conductive film 311 and part of the conductive film 312, the gate electrode 303 may be provided so as to overlap with part of the conductive film 312 and the conductive film 313. As a result, the dual-gate transistor 300a is positioned on an inner side than the single-gate transistor 300b.

Even with this structure, the channel width with respect to the area occupied by the multi-gate transistor 300 can be large, and larger drain current can be obtained.

Modification Example 2

In FIGS. 9A to 9E, the gate electrode 317, which is shared by the transistors 300a and 300b, is formed over the semiconductor film 309, and the gate electrode 303 formed in the transistor 300a is provided between the semiconductor film 309 and the substrate 301. However, the gate electrode 317 may be provided between the semiconductor film 309 and the substrate 301, and the gate electrode 303 may be provided over the semiconductor film 309.

Even with this structure, the channel width with respect to the area occupied by the multi-gate transistor 300 can be large, and larger drain current can be obtained.

Modification Example 3

In the transistor 300b shown in FIGS. 9A to 9E, the gate electrode 317 overlaps with each of the edges of the conductive films 312 and 313. That is, in the semiconductor film 309, a region between the conductive films 312 and 313 serve as the channel region. In a transistor of Modification Example 3, the gate electrode 317 may be positioned to overlap with one of the conductive films 312 and 313. As a result, such region of the semiconductor film 309 that does not overlap with the gate electrode 317 serves as an offset region. With the provision of the offset region, occurrence of leakage current in the semiconductor film 309 and the gate electrode 317 can be inhibited even in the case where the withstand voltage of the insulating film 315 serving as the gate insulating film is low.

In addition, the channel width with respect to the area occupied by the multi-gate transistor 300 can be large, and larger drain current can be obtained.

As described above, the multi-gate transistor of one embodiment of the present invention can obtain both large drain current and high drain withstand voltage; therefore, it can be favorably used in a semiconductor device for high-power application (such as a high-voltage device with a higher withstand voltage compared to silicon). Furthermore, a semiconductor material having a wider band gap than silicon is used for the semiconductor film, whereby a stable operation can be performed even at a high temperature. In particular, in the multi-gate transistor of one embodiment of the present invention, large current can flow, so that self-heating at the time of driving is enhanced in some cases. With the semiconductor device for high-power application, the temperature of usage environment becomes high because of heat generation from other elements in some cases. However, the multi-gate transistor of one embodiment of the present invention can maintain its stable electrical characteristics even in such high temperature environments, and the reliability of the semiconductor device using the transistor in high temperature environments can be improved.

This embodiment can be combined with any of the other embodiments disclosed in this specification as appropriate.

Embodiment 4

An oxide semiconductor that can be favorably used for a semiconductor film of a semiconductor device of one embodiment of the present invention will be described in this embodiment.

An oxide semiconductor has a wide energy gap of 3.0 eV or more. A transistor using an oxide semiconductor film obtained by processing an oxide semiconductor in an appropriate condition while sufficiently reducing the carrier density can have much lower leakage current between a source and a drain in an off state (off-state current) than a conventional transistor using silicon.

Alternatively, a material represented by $InMO_3(ZnO)_m$ (m>0, and m is not an integer) may be used as an oxide semiconductor. Note that M represents one or more metal elements selected from Ga, Fe, Mn, and Co, or the above-described element as a stabilizer. Alternatively, as the oxide semiconductor, a material represented by a chemical formula, $In_2SnO_5(ZnO)_n$ (n>0, and n is an integer) may be used.

When the oxide semiconductor film contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, and treatment for making the oxygen content of an oxide semiconductor film be in excess of that of the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

Thus, the transistor including an i-type or substantially i-type oxide semiconductor film can have extremely favorable off-state current characteristics. For example, the drain current at the time when the transistor using an oxide semiconductor film is in an off-state can be less than or equal to $1\times10^{-18}$ A, preferably less than or equal to $1\times10^{-21}$ A, further preferably less than or equal to $1\times10^{-24}$ A at room temperature (about 25° C.); or less than or equal to $1\times10^{-15}$ A, preferably less than or equal to $1\times10^{-18}$ A, further preferably less than or equal to $1\times10^{-21}$ A at 85° C. Note that an off state of an n-channel transistor refers to a state where the gate voltage is sufficiently lower than the threshold voltage. Specifically, the transistor is in an off state when the gate voltage is lower than the threshold voltage by 1 V or more, 2 V or more, or 3 V or more.

A structure of the oxide semiconductor film will be described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

The CAAC-OS film is one of oxide semiconductor films having a plurality of c-axis aligned crystal parts.

When a combined analysis image (also referred to as a high-resolution TEM image) of a bright-field image and a diffraction pattern of the CAAC-OS film is observed by a transmission electron microscope (TEM), a plurality of crystal parts is seen. However, in the high-resolution TEM image, a boundary between crystal parts, that is, a grain boundary is difficult to be observed. Thus, in the CAAC-OS film, a reduction in electron mobility due to the grain boundary is less likely to occur.

In a high-resolution cross-sectional TEM image of the CAAC-OS film observed in a direction substantially parallel to a sample surface, metal atoms are arranged in a layered manner in the crystal parts. Each layer of metal atoms has such a form that reflects unevenness of the surface over which the CAAC-OS film is formed (hereinafter, the surface over which the CAAC-OS film is formed is referred to as a formation surface) or the top surface of the CAAC-OS film, and is arranged in parallel to the formation surface or the top surface of the CAAC-OS film.

In a high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

From the high-resolution cross-sectional TEM image and high-resolution plan-view TEM image observations, alignment is found in the crystal parts in the CAAC-OS film.

Note that most of the crystal parts contained in the CAAC-OS film each fit inside a cube whose one side is less than 100 nm. Thus, there is a case where a crystal part contained in the CAAC-OS film fits inside a cube whose one side is less than 10 nm, less than 5 nm, or less than 3 nm. Note that when a plurality of crystal parts contained in the CAAC-OS film are connected to each other, one large crystal region is formed in some cases. For example, a crystal region with an area of 2500 $nm^2$ or more, 5 $\mu m^2$ or more, or 1000 $\mu m^2$ or more is observed in some cases in the high-resolution plan-view TEM image.

A CAAC-OS film is subjected to structural analysis with an X-ray diffraction (XRD) apparatus. For example, when the CAAC-OS film having an $InGaZnO_4$ crystal is analyzed by an out-of-plane method, a peak appears frequently when the diffraction angle (2θ is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (q, scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. As for a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of the formation surface or a normal vector of the top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of the formation surface or a normal vector of the top surface of the CAAC-OS film. Thus, for example, in the case where a shape of the CAAC-OS film is changed by etching or the like, the c-axis of the crystal might not necessarily be parallel to a normal vector of the formation surface or a normal vector of the top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, the crystallinity of a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appears at around 31° and a peak of 2θ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element constituting the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor using the oxide semiconductor film rarely has negative threshold voltage (such electrical characteristics are also referred to as normally on). The highly purified intrinsic or substantially highly purified intrinsic oxide semiconductor film has few carrier traps. Accordingly, the transistor using the oxide semiconductor film has little change in electrical characteristics and high reliability. Electric charge trapped by the carrier traps in the oxide semiconductor film takes a long time to be released, and might behave like fixed electric charge. Thus, the transistor that uses the oxide semiconductor film having high impurity concentration and a high density of defect states has unstable electrical characteristics in some cases.

With the use of the CAAC-OS film in a transistor, a change in the electrical characteristics of the transistor due to irradiation with visible light or ultraviolet light is small.

Next, a microcrystalline oxide semiconductor film will be described.

A microcrystalline oxide semiconductor film has a region where a crystal part can be found in the high-resolution TEM image and a region where a clear crystal part cannot be easily found in the high-resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nanocrystalline oxide semiconductor (nc-OS) film. In a high-resolution TEM observation image, for example, a clear crystal grain cannot be easily found in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a beam diameter larger than the diameter of a crystal part, a peak which shows a crystal plane does not appear. Further, a diffraction pattern like a halo pattern appears in a selected-area electron diffraction pattern of the nc-OS film that is obtained by using an electron beam having a probe diameter (e.g., larger than or equal to 50 nm) larger than the diameter of a crystal part. Meanwhile, spots are observed in a diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are observed in some cases. Also in a nanobeam electron diffraction pattern of the nc-OS film, a plurality of spots is shown in a ring-like region in some cases.

The nc-OS film is an oxide semiconductor film that has higher regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked-layer film including two or more films of an amorphous oxide semiconductor film, a microcrystalline oxide semiconductor film, and a CAAC-OS film, for example.

This embodiment can be combined with any of the other embodiments disclosed in this specification as appropriate.

Embodiment 5

In this embodiment, configuration examples of power converter circuits such as an inverter and a converter each including any of the transistors described in the above embodiments will be described as an example of a semiconductor device that is one embodiment of the present invention.

<DC-DC Converter>

Figure 10A:
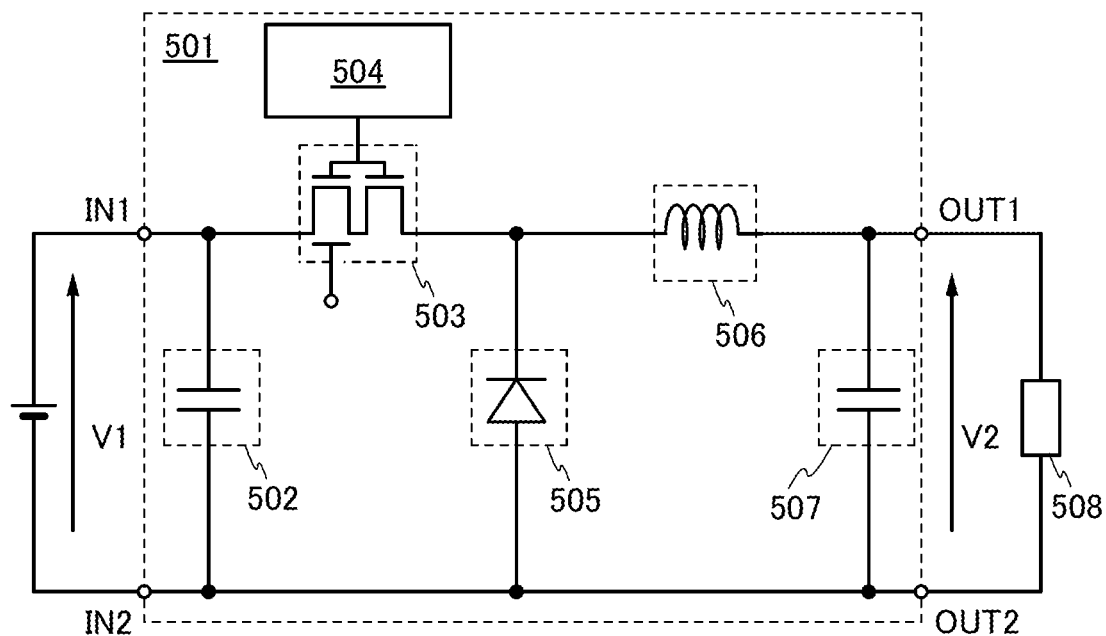
FIGS. 10A and 10B illustrate configuration examples of power converter circuits of embodiments.

A DC-DC converter 501 in FIG. 10A is an example of a step-down DC-DC converter using a chopper circuit. The DC-DC converter 501 includes a capacitor 502, a transistor 503, a control circuit 504, a diode 505, a coil 506, and a capacitor 507.

The DC-DC converter 501 is operated by a switching operation of the transistor 503 with the control circuit 504. By the DC-DC converter 501, an input voltage V1 applied to input terminals IN1 and IN2 can be output from output terminals OUT1 and OUT2 to a load 508 as a voltage V2 which is stepped down. Any of the multi-gate transistors described in the above embodiments can be used as the transistor 503 included in the DC-DC converter 501. Accordingly, the off-state current can be reduced. Therefore, the DC-DC converter consumes less power.

Although the step-down DC-DC converter using a chopper circuit is shown in FIG. 10A as an example of a non-isolated power converter circuit, any of the multi-gate transistors described in the above embodiments can also be used as a transistor included in a step-up DC-DC converter using a chopper circuit or a step-up/step-down DC-DC converter using a chopper circuit. Accordingly, the off-state current can be reduced. Therefore, the DC-DC converter consumes less power.

Figure 10B:
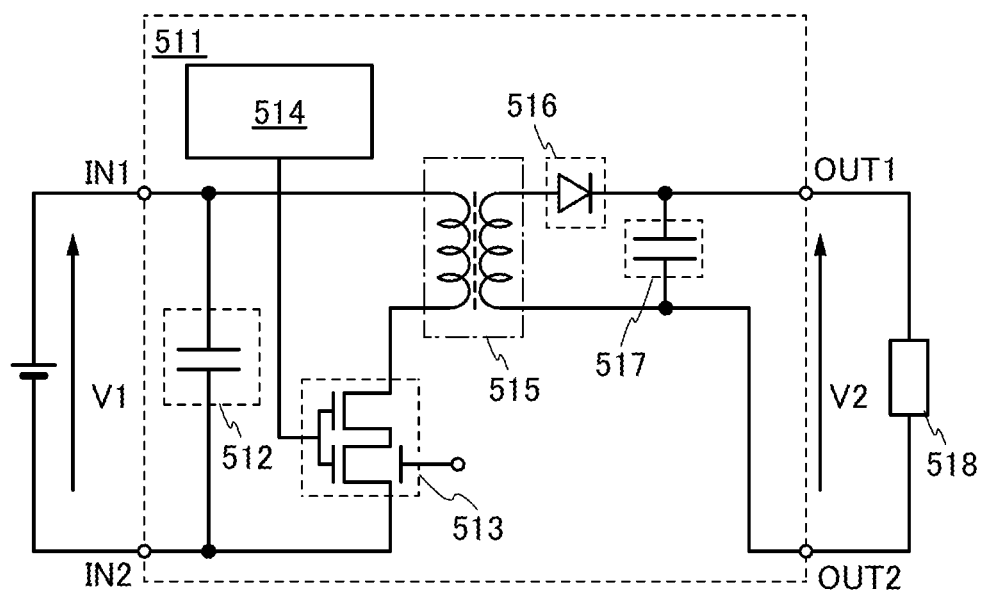

Next, a DC-DC converter 511 illustrated in FIG. 10B is an example of a fly-back converter which is an isolated power converter circuit. The DC-DC converter 511 includes a capacitor 512, a transistor 513, a control circuit 514, a transformer 515 including a primary coil and a secondary coil, a diode 516, and a capacitor 517.

The DC-DC converter 511 in FIG. 10B is operated by a switching operation of the transistor 513 with the control circuit 514. By the DC-DC converter 511, an input voltage V1 applied to input terminals IN1 and IN2 can be output from output terminals OUT1 and OUT2 to a load 518 as a voltage V2 which is stepped up or stepped down.

Any of the multi-gate transistors described in the above embodiments can be used as the transistor 513 included in the DC-DC converter 511. Accordingly, the off-state current can be reduced. Therefore, the DC-DC converter consumes less power.

Note that any of the multi-gate transistors described in the above embodiments can also be used as a transistor included in a forward DC-DC converter.

<Inverter>

Figure 11:
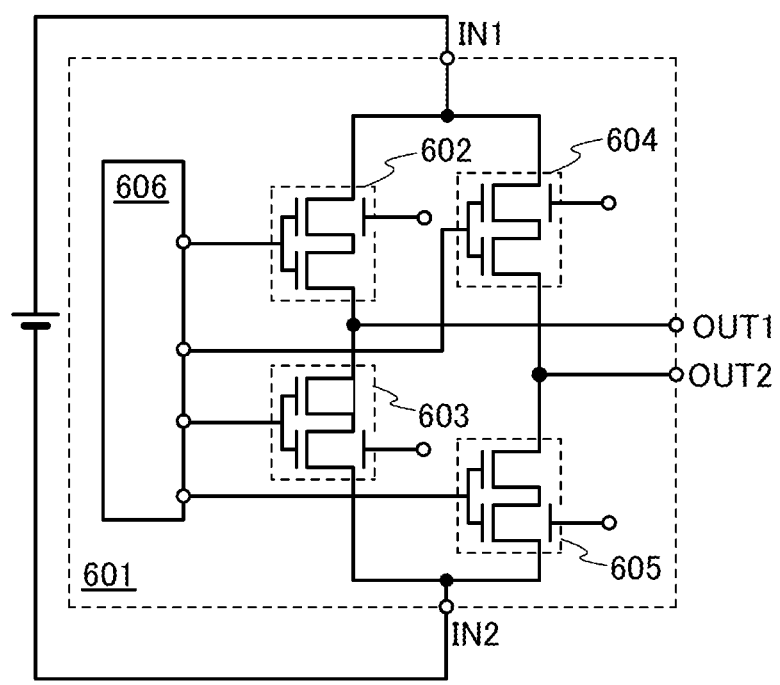
FIG. 11 illustrates a configuration example of a power converter circuit of an embodiment.

An inverter 601 in FIG. 11 is an example of a full-bridge inverter. The inverter 601 includes a transistor 602, a transistor 603, a transistor 604, a transistor 605, and a control circuit 606.

The inverter 601 in FIG. 11 is operated by a switching operation of the transistors 602 to 605 with the control circuit 606. A direct-current voltage V1 applied to input terminals IN1 and IN2 can be output from output terminals OUT1 and OUT2 as an alternating-current voltage V2. Any of the multi-gate transistors described in the above embodiments can be used as each of the transistors 602 to 605 included in the inverter 601. Accordingly, the off-state current can be reduced. Therefore, the inverter consumes less power.

In the case where the transistor described in the above embodiments is used for the circuit shown in FIGS. 10A and 10B and FIG. 11, the source electrode is electrically connected to the low potential side and the drain electrode is electrically connected to the high potential side. Further, the potential of the first gate electrode (and the third gate electrode) may be controlled by a control circuit or the like, and the potential described above as an example, e.g., a potential lower than the potential applied to the source electrode may be input to the second gate electrode through a wiring that is not illustrated.

This embodiment can be combined with any of the other embodiments disclosed in this specification as appropriate.

Embodiment 6

In this embodiment, a configuration example of a power supply circuit including the transistor described in the above embodiments will be described as an example of a semiconductor device of one embodiment of the present invention.

Figure 12:
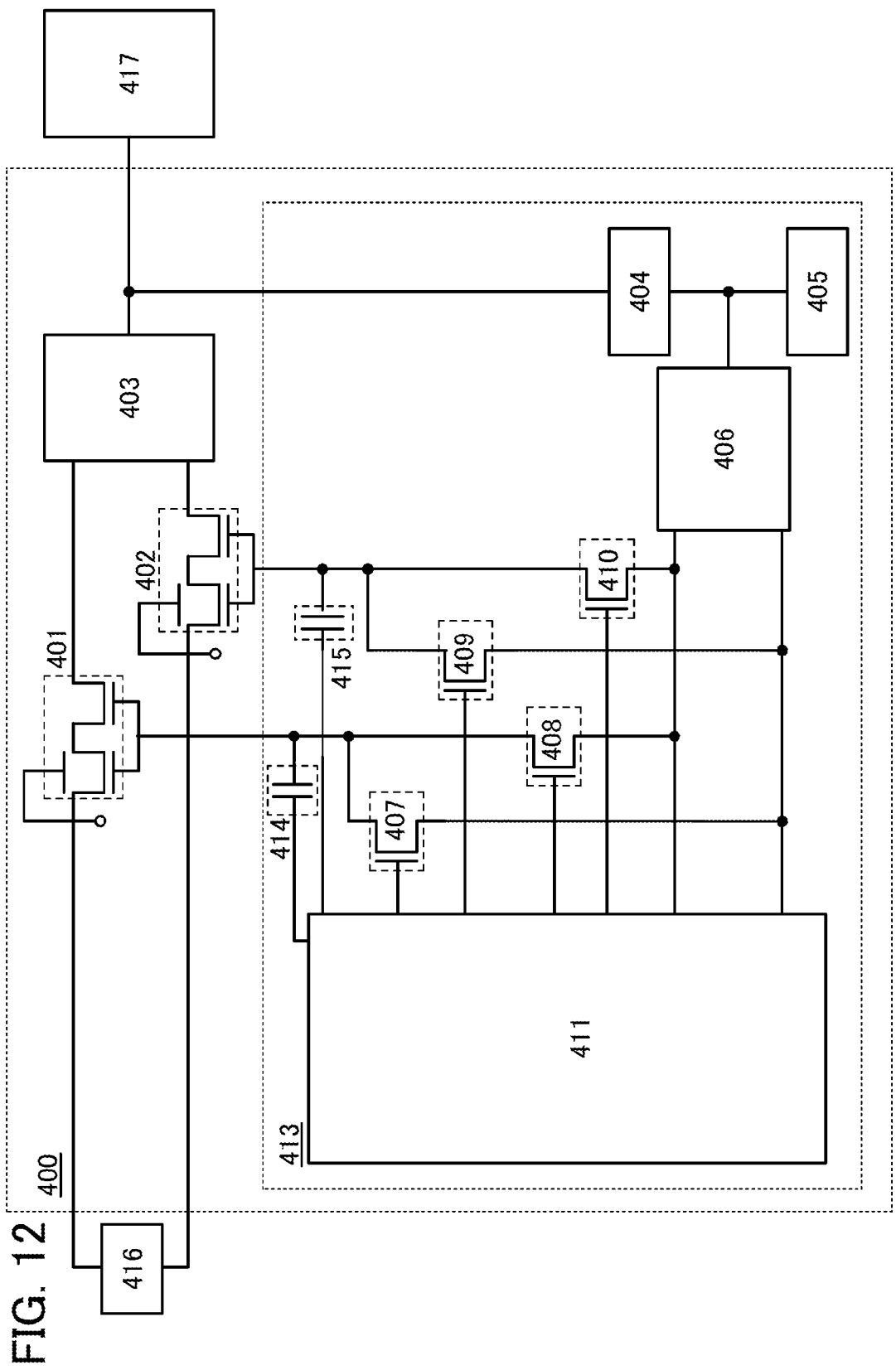
FIG. 12 illustrates a configuration example of a power supply circuit of an embodiment.

FIG. 12 illustrates a configuration example of a power supply circuit 400 of one embodiment of the present invention. The power supply circuit 400 in FIG. 12 includes a control circuit 413, a power switch 401, a power switch 402, and a voltage regulator 403.

Voltage is supplied from a power supply 416 to the power supply circuit 400. The power switches 401 and 402 each have a function of controlling input of the voltage to the voltage regulator 403.

Note that in the case where the voltage output from the power supply 416 is AC voltage, as illustrated in FIG. 12, the power switch 401 controlling input of a first potential to the voltage regulator 403 and the power switch 402 controlling input of a second potential to the voltage regulator 403 are provided in the power supply circuit 400. In the case where the voltage output from the power supply 416 is DC voltage, as illustrated in FIG. 12, the power switch 401 controlling input of the first potential to the voltage regulator 403 and the power switch 402 controlling input of the second potential to the voltage regulator 403 may be provided in the power supply circuit 400; alternatively, the second potential may be a ground potential, the power switch 402 controlling input of the second potential to the voltage regulator 403 may be eliminated, and the power switch 401 controlling input of the first potential to the voltage regulator 403 may be provided in the power supply circuit 400.

In one embodiment of the present invention, a transistor having high withstand voltage is used as each of the power switches 401 and 402. For example, any of the transistors described in the above embodiments can be used as the transistor.

When the multi-gate transistor with the oxide semiconductor film having the crystalline structure is used as each of the power switches 401 and 402, high output current can flow through the power switches 401 and 402 and the power switches 401 and 402 can each have high withstand voltage.

By utilizing as the power switch 401 or 402 a field-effect transistor using the above semiconductor materials for the film where a channel region is formed, the off-state current of the power switch 401 or 402 can be lower than that of a field-effect transistor using silicon carbide or gallium nitride for an active layer. In this way, power loss due to the switching can be small.

The voltage regulator 403 has a function of regulating voltage input from the power supply 416 through the power switches 401 and 402. Specifically, voltage regulation in the voltage regulator 403 means any one or more of conversion of AC voltage into DC voltage, change of a voltage level, smoothing of a voltage level, and the like.

Voltage regulated in the voltage regulator 403 is applied to a load 417 and the control circuit 413.

In addition, the power supply circuit 400 in FIG. 12 includes a power storage device 404, an auxiliary power supply 405, a voltage generation circuit 406, transistors 407 to 410, and capacitors 414 and 415.

The power storage device 404 has a function of temporarily storing power supplied from the voltage regulator 403. Specifically, the power storage device 404 includes a power storage portion such as a capacitor or a secondary battery that can store power with the use of voltage applied from the voltage regulator 403.

The auxiliary power supply 405 has a function of compensating for the lack of power output from the power storage device 404 for operation of the control circuit 413. A primary battery or the like can be used as the auxiliary power supply 405.

The voltage generation circuit 406 has a function of generating voltage for controlling switching of the power switches 401 and 402 with the use of voltage output from the power storage device 404 or the auxiliary power supply 405. Specifically, the voltage generation circuit 406 has a function of generating voltage for turning on the power switches 401 and 402 and a function of generating voltage for turning off the power switches 401 and 402.

A wireless signal input circuit 411 has a function of controlling the power switches 401 and 402 in accordance with switching of the transistors 407 to 410.

Specifically, the wireless signal input circuit 411 includes an input portion that converts an instruction superimposed on a wireless signal given from the outside to control the operating states of the power switches 401 and 402 into an electric signal, and a signal processor that decodes the instruction included in the electric signal and generates a signal for controlling the switching of the transistors 407 to 410 in accordance with the instruction.

The transistors 407 to 410 switch in accordance with the signal generated in the wireless signal input circuit 411. Specifically, when the transistors 408 and 410 are on, the voltage for turning on the power switches 401 and 402 that is generated in the voltage generation circuit 406 is applied to the power switches 401 and 402. When the transistors 408 and 410 are off, the voltage for turning on the power switches 401 and 402 is continuously applied to the power switches 401 and 402. Further, when the transistors 407 and 409 are on, the voltage for turning off the power switches 401 and 402 that is generated in the voltage generation circuit 406 is applied to the power switches 401 and 402. When the transistors 408 and 410 are off, the voltage for turning off the power switches 401 and 402 is continuously applied to the power switches 401 and 402.

In one embodiment of the present invention, a transistor with extremely low off-state current is used as each of the transistors 407 to 410 so that the voltage is continuously applied to the power switches 401 and 402. With this structure, even when generation of the voltage for determining the operating states of the power switches 401 and 402 in the voltage generation circuit 406 is stopped, the operating states of the power switches 401 and 402 can be kept. Thus, the power consumption of the voltage generation circuit 406 is reduced, so that the power consumption of the power supply circuit 400 can be reduced.

Note that the transistors 407 to 410 may be provided with back gates, which are supplied with voltage, in order to control the threshold voltages of the transistors 407 to 410.

Since a transistor using a wide-gap semiconductor whose band gap is two or more times that of silicon in an active layer has extremely low off-state current, the transistor is preferably used as each of the transistors 407 to 410. For example, an oxide semiconductor or the like can be used as the wide-gap semiconductor.

Among the oxide semiconductors, unlike silicon carbide or gallium nitride, an In—Ga—Zn-based oxide, an In—Sn—Zn-based oxide, or the like has an advantage of high mass productivity because a transistor with favorable electrical characteristics can be formed by sputtering or a wet process. Further, unlike silicon carbide or gallium nitride, the oxide semiconductor (the In—Ga—Zn-based oxide) can be deposited even at room temperature; thus, a transistor with favorable electrical characteristics can be formed over a glass substrate or an integrated circuit using silicon. Further, a larger substrate can be used.

The capacitor 414 has a function of holding voltage applied to the power switch 401 when the transistors 407 and 408 are off. The capacitor 415 has a function of holding voltage applied to the power switch 402 when the transistors 409 and 410 are off. One of a pair of electrodes of each of the capacitors 414 and 415 is connected to the wireless signal input circuit 411. Note that as illustrated in FIG. 13, the capacitors 414 and 415 need not necessarily be provided.

When the power switches 401 and 402 are on, voltage is supplied from the power supply 416 to the voltage regulator 403. In addition, with the voltage, power is stored in the power storage device 404.

When the power switches 401 and 402 are off, supply of voltage from the power supply 416 to the voltage regulator 403 is stopped. Thus, although power is not supplied to the power storage device 404, the control circuit 413 can be operated using power stored in the power storage device 404 or the auxiliary power supply 405 in one embodiment of the present invention, as described above. In other words, in the power supply circuit 400 according to one embodiment of the present invention, supply of voltage to the voltage regulator 403 can be stopped while the operating states of the power switches 401 and 402 are controlled by the control circuit 413. By stopping the supply of voltage to the voltage regulator 403, it is possible to prevent power consumption due to charging and discharging of the capacitance of the voltage regulator 403 when voltage is not supplied to the load 417. Consequently, the power consumption of the power supply circuit 400 can be reduced.

Figure 13:
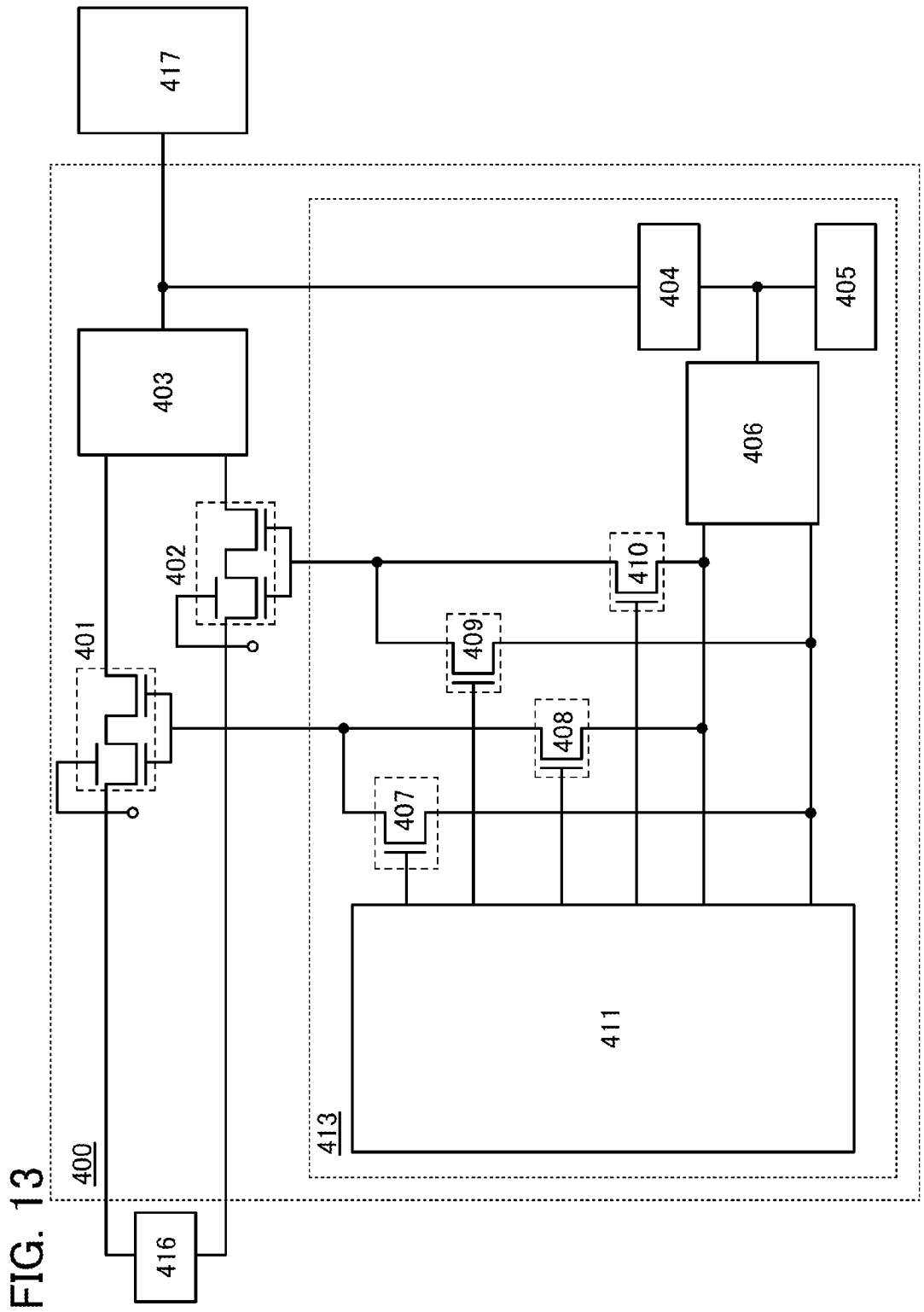
FIG. 13 illustrates a configuration example of a power supply circuit of an embodiment.

In the case where the transistor described in the above embodiments is used for the circuit shown in FIGS. 12 and 13, the source electrode (the first electrode) is electrically connected to the low potential side and the drain electrode (the second electrode) is electrically connected to the high potential side. Further, the potential of the first gate electrode (and the third gate electrode) may be controlled by a control circuit, and a potential lower than the potential applied to the source electrode may be input to the second gate electrode through a wiring that is not illustrated.

This embodiment can be combined with any of the other embodiments disclosed in this specification as appropriate.

Embodiment 7

In this embodiment, a configuration of a buffer circuit including the transistor of one embodiment of the present invention will be described.

The transistor of one embodiment of the present invention can be used in a buffer circuit for supplying voltage to a gate of a power switch.

Figure 14A:
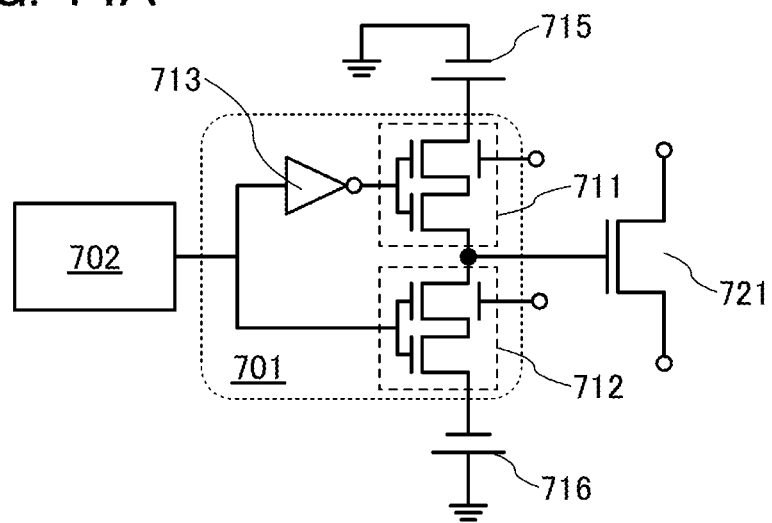
FIGS. 14A and 14B illustrate configuration examples of buffer circuits of embodiments.

FIG. 14A shows a circuit including a buffer circuit 701 of one embodiment of the present invention.

A driver circuit 702 and a power switch 721 are electrically connected to the buffer circuit 701. A positive potential from a power supply 715 and a negative potential from a power supply 716 are applied to the buffer circuit 701.

The driver circuit 702 outputs a signal for controlling on/off operation of the power switch 721. A signal output from the driver circuit 702 is input to a gate of the power switch 721 through the buffer circuit 701.

For the power switch 721, any of the transistors described in the above embodiments or a power transistor using silicon, silicon carbide, gallium nitride, or the like as a semiconductor can be used. Here, the case where the power switch 721 is an n-channel transistor will be described below; however, the power switch 721 may be a p-channel transistor.

The buffer circuit 701 includes a transistor 711, a transistor 712, and an inverter 713.

One of a source and a drain of the transistor 711 is electrically connected to a high-potential output terminal of the power supply 715, the other of the source and the drain is electrically connected to one of a source and a drain of the transistor 712 and a gate of the power switch 721, and a gate of the transistor 711 is electrically connected to an output terminal of the inverter 713. The other of the source and the drain of the transistor 712 is electrically connected to a low-potential output terminal of the power supply 716. An output portion of the driver circuit 702 is electrically connected to an input terminal of the inverter 713 and a gate of the transistor 712.

A high-level potential or a low-level potential is output from the driver circuit 702. Here, the high-level potential is at least a potential for turning on the transistor 712 and the low-level potential is at least a potential for turning off the transistor 712.

When the high-level potential is input from the driver circuit 702, the low-level potential is input to the gate of the transistor 711 through the inverter 713, so that the transistor 711 is turned off. At the same time, the high-level potential is input to the gate of the transistor 712, so that the transistor 712 is turned on. Thus, the negative potential is input to the gate of the power switch 721 from the power supply 716, so that the power switch 721 is turned off.

When the low-level potential is input from the driver circuit 702, the high-level potential is input to the gate of the transistor 711 through the inverter 713, so that the transistor 711 is turned on. At the same time, the low-level potential is input to the gate of the transistor 712, so that the transistor 712 is turned off. Thus, the positive potential is input to the gate of the power switch 721 from the power supply 715, so that the power switch 721 is turned on.

As described above, a pulse signal having a high-level potential or a low-level potential is output from the driver circuit 702, whereby on/off operation of the power switch 721 can be controlled. As a method for controlling the power switch 721, a pulse width modulation (PWM) method, a pulse frequency modulation (PFM) method, or the like can be used.

Here, any of the multi-gate transistors described in the above embodiments can be used as each of the transistor 711 and the transistor 712. Thus, the power switch 721 can be driven at a high potential. Moreover, these transistors can operate stably at a high temperature; thus, these transistors can stably control the operation of the power switch even in a high-temperature environment and can be placed near the power switch 721 which generates a large amount of heat. By the switching operation of the transistors 711 and 712, a large amount of output current can flow and the off-state current can be reduced. Therefore, the buffer circuit which consumes less power and can operate at high speed can be obtained.

Figure 14B:
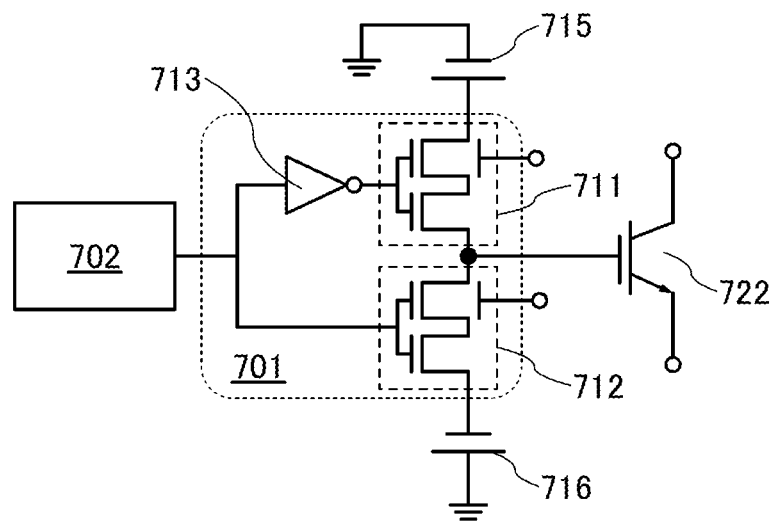

In FIGS. 14A and 14B, the power supply 716 which outputs a negative potential is provided; however, a ground potential (or a reference potential) may be input to the other of the source and the drain of the transistor 712 without the power supply 716.

Alternatively, the inverter 713 may be electrically connected to the transistor 712 instead of the transistor 711. In that case, in the above operation, a potential inverted from the above potential is output from the buffer circuit 701.

Here, instead of the power switch 721, a high-voltage device having higher withstand voltage than silicon, such as a bipolar power transistor, an insulated gate bipolar transistor (IGBT), a thyristor, a gate turnoff thyristor (GTO), a triac, or a metal semiconductor field-effect transistor (MESFET) can be used.

At this time, the output signal of the driver circuit 702 is not limited to the above signal, and a signal suitable for controlling the driving of each element may be used.

In FIG. 14B, an IGBT 722 is provided instead of the power switch 721.

In the case where any of the transistors described in the above embodiments is used for the circuit shown in FIGS. 14A and 14B, the source electrode (the first electrode) is electrically connected to the low potential side and the drain electrode (the second electrode) is electrically connected to the high potential side. Furthermore, the potential of the first gate electrode (and the third gate electrode) may be controlled by a control circuit, and a potential lower than the potential applied to the source electrode may be input to the second gate electrode through a wiring that is not illustrated.

This embodiment can be combined with any of the other embodiments disclosed in this specification as appropriate.

Embodiment 8

In this embodiment, an example of a semiconductor device (memory device) using a transistor having an oxide semiconductor of one embodiment of the present invention, which can retain stored data even when not powered, and which has an unlimited number of write cycles will be described with reference to drawings.

Figure 15:
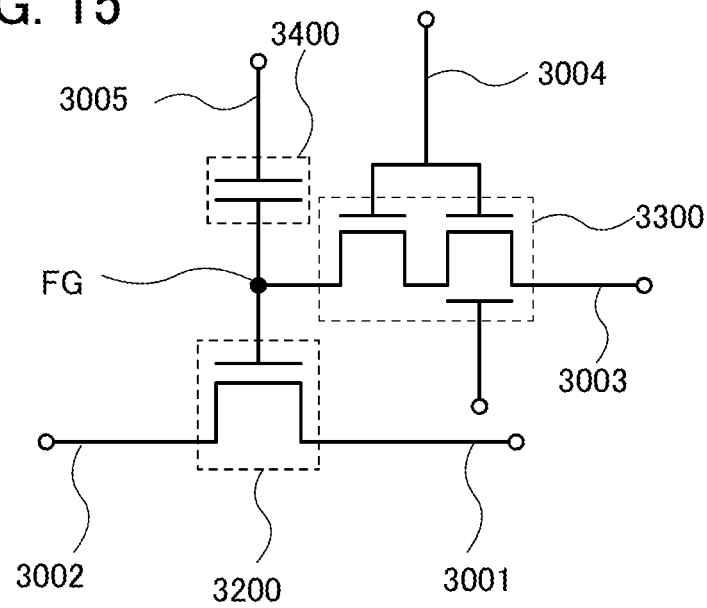
FIG. 15 illustrates a memory device of an embodiment.

FIG. 15 is a circuit diagram of a semiconductor device.

The semiconductor device illustrated in FIG. 15 includes a transistor 3200 using a first semiconductor material, a transistor 3300 using a second semiconductor material, and a capacitor 3400. As the transistor 3300, any of the transistors described in the above embodiments can be used.

Here, the first semiconductor material and the second semiconductor material are preferably materials having different band gaps. For example, the first semiconductor material may be a semiconductor material (e.g., silicon, germanium, silicon germanium, silicon carbide, or gallium arsenic) other than an oxide semiconductor, and the second semiconductor material may be the oxide semiconductor described in the above embodiments. A transistor using single crystal silicon or the like, as a material other than an oxide semiconductor, can operate at high speed easily. In contrast, a transistor using an oxide semiconductor has low off-state current.

The transistor 3300 is a transistor in which a channel region is formed in a semiconductor film including an oxide semiconductor. Since the off-state current of the transistor 3300 is low, stored data can be retained for a long period owing to such a transistor. In other words, a memory device in which refresh operation is not needed or the frequency of refresh operation is extremely low can be provided, which results in a sufficient reduction in power consumption.

In FIG. 15, a first wiring 3001 is electrically connected to a source electrode of the transistor 3200. A second wiring 3002 is electrically connected to a drain electrode of the transistor 3200. A third wiring 3003 is electrically connected to one of a source electrode or a drain electrode of the transistor 3300. A fourth wiring 3004 is electrically connected to a gate electrode of the transistor 3300. A gate electrode of the transistor 3200 and the other of the source electrode or the drain electrode of the transistor 3300 are electrically connected to one electrode of the capacitor 3400. A fifth wiring 3005 is electrically connected to the other electrode of the capacitor 3400.

The semiconductor device in FIG. 15 utilizes a characteristic in which the potential of the gate electrode of the transistor 3200 can be held, and thus enables writing, holding, and reading of data as follows.

Writing and holding of data will be described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, predetermined charge is supplied to the gate electrode of the transistor 3200 (writing). Here, charge for supplying either of two different potential levels (hereinafter referred to as low-level charge and high-level charge) is given. Then, the potential of the fourth wiring 3004 is set to a potential at which the transistor 3300 is turned off, so that the transistor 3300 is turned off. Thus, the charge given to the gate electrode of the transistor 3200 is held (holding).

Since the off-state current of the transistor 3300 is extremely small, the charge of the gate electrode of the transistor 3200 is held for a long time.

Next, reading of data will be described. By supplying an appropriate potential (a reading potential) to the fifth wiring 3005 while supplying a predetermined potential (a constant potential) to the first wiring 3001, the potential of the second wiring 3002 varies depending on the amount of charge held in the gate electrode of the transistor 3200. This is because in general, when the transistor 3200 is an n-channel transistor, an apparent threshold voltage $V_{th\_H}$ in the case where a high-level charge is given to the gate electrode of the transistor 3200 is lower than an apparent threshold voltage $V_{th\_L}$ in the case where a low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied in writing, when the potential of the fifth wiring 3005 is $V_0$ ($>V_{th\_H}$), the transistor 3200 is turned on. In the case where the low-level charge is supplied in writing, even when the potential of the fifth wiring 3005 is $V_0$ ($<V_{th\_L}$), the transistor 3200 remains off. Therefore, the held data can be read by determining the potential of the second wiring 3002.

Note that in the case where memory cells are arrayed to be used, only data of desired memory cells needs to be read. In the case where such reading is not performed, a potential at which the transistor 3200 is off regardless of the state of the gate electrode, that is, a potential smaller than $V_{th\_H}$ may be applied to the fifth wiring 3005. Alternatively, a potential at which the transistor 3200 is on regardless of the state of the gate electrode, that is, a potential larger than $V_{th\_L}$ may be applied to the fifth wiring 3005.

When a transistor with an oxide semiconductor film as the semiconductor film, which has extremely small off-state current, is used in the semiconductor device in this embodiment, the semiconductor device can hold stored data for an extremely long period. In other words, power consumption can be sufficiently reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is unlikely to be caused. In other words, the semiconductor device according to one embodiment of the disclosed invention does not have a limit on the number of times of writing which is a problem in a conventional nonvolatile memory, and reliability thereof is drastically improved. Furthermore, data is written depending on the on state and the off state of the transistor, whereby high-speed operation can be easily achieved.

In the case where any of the transistors described in the above embodiments is used for the circuit shown in FIG. 15, the source electrode (the first electrode) is electrically connected to the low potential side and the drain electrode (the second electrode) is electrically connected to the high potential side. Further, the potential of the first gate electrode (and the third gate electrode) may be controlled by a control circuit or the like, and a potential lower than the potential applied to the source electrode may be input to the second gate electrode through a wiring that is not illustrated.

This embodiment can be combined with any of the other embodiments disclosed in this specification as appropriate.

Embodiment 9

In this embodiment, a structural example of a display panel of one embodiment of the present invention will be described.

Structural Example

Figure 16A:
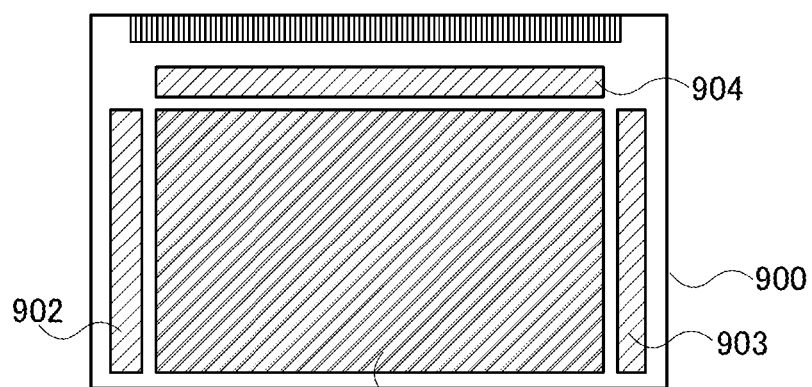
FIGS. 16A to 16C illustrate a structure of a display panel of an embodiment.
Figure 16B:
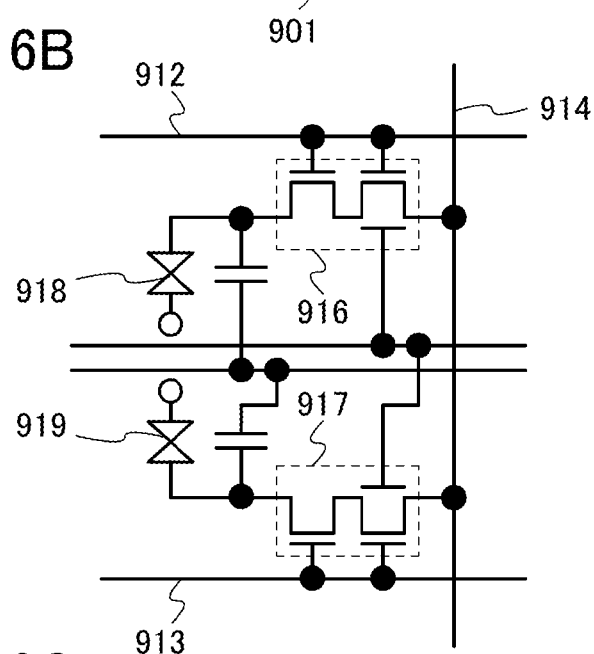
Figure 16C:
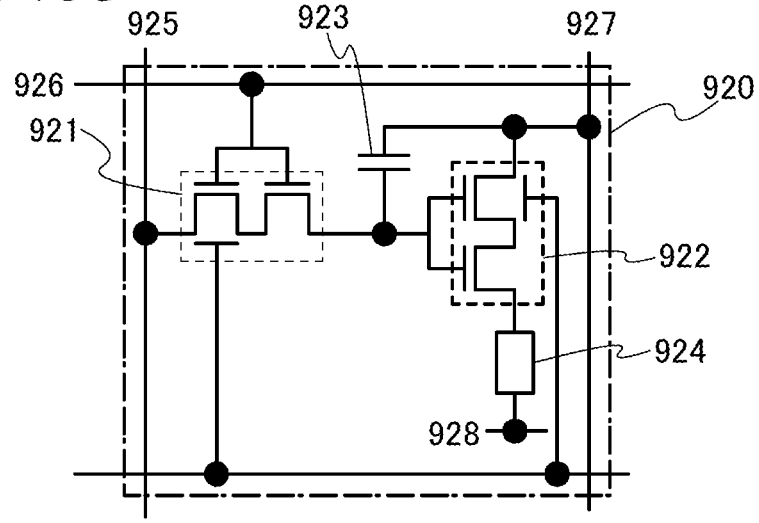

FIG. 16A is a top view of the display panel of one embodiment of the present invention. FIG. 16B is a circuit diagram illustrating a pixel circuit that can be used in the case where a liquid crystal element is used in a pixel in the display panel of one embodiment of the present invention. FIG. 16C is a circuit diagram illustrating a pixel circuit that can be used in the case where an organic EL element is used in a pixel in the display panel of one embodiment of the present invention.

The transistor in the pixel portion can be formed in accordance with the above embodiments. Further, the transistor can easily be an n-channel transistor, and thus, part of a driver circuit that can be formed using an n-channel transistor in the driver circuit is formed over the same substrate as the transistor of the pixel portion. With the use of any of the transistors described in the above embodiments for the pixel portion or the driver circuit in this manner, a highly reliable display device can be provided.

FIG. 16A illustrates an example of a block diagram of an active matrix display device. A pixel portion 901, a first scan line driver circuit 902, a second scan line driver circuit 903, and a signal line driver circuit 904 are provided over a substrate 900 in the display device. In the pixel portion 901, a plurality of signal lines extended from the signal line driver circuit 904 are arranged, and a plurality of scan lines extended from the first scan line driver circuit 902 and the second scan line driver circuit 903 are arranged. Pixels each including a display element are provided in matrix in respective regions in each of which the scan line and the signal line intersect with each other. The substrate 900 of the display device is connected to a timing control circuit (also referred to as controller or control IC) through a connection portion such as a flexible printed circuit (FPC).

In FIG. 16A, the first scan line driver circuit 902, the second scan line driver circuit 903, and the signal line driver circuit 904 are formed over the same substrate 900 as the pixel portion 901. Accordingly, the number of components such as a driver circuit, which are provided outside, is reduced, so that a reduction in cost can be achieved. Further, if the driver circuit is provided outside the substrate 900, wirings would need to be extended and the number of wiring connections would increase. However, by providing the driver circuit over the substrate 900, the number of wiring connections can be reduced and the reliability or yield can be improved.

<Liquid Crystal Panel>

FIG. 16B illustrates an example of a circuit configuration of the pixel. Here, a pixel circuit that can be used in a pixel of a VA liquid crystal display panel is illustrated.

This pixel circuit can be used in a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 912 of a transistor 916 and a gate wiring 913 of a transistor 917 are separated so that different gate signals can be given thereto. In contrast, a source or drain electrode 914 serving as a data line is used in common for the transistors 916 and 917. Any of the transistors described in the above embodiments can be used as appropriate as each of the transistors 916 and 917. In this way, a highly reliable liquid crystal display panel can be provided.

The shapes of a first pixel electrode electrically connected to the transistor 916 and a second pixel electrode electrically connected to the transistor 917 will be described. The first pixel electrode and the second pixel electrode are separated by a slit. The first pixel electrode has a V shape and the second pixel electrode is provided so as to surround the first pixel electrode.

A gate electrode of the transistor 916 is connected to the gate wiring 912, and a gate electrode of the transistor 917 is connected to the gate wiring 913. When different gate signals are supplied to the gate wiring 912 and the gate wiring 913, operation timings of the transistor 916 and the transistor 917 can be varied. As a result, alignment of liquid crystals can be controlled.

Further, a storage capacitor may be formed using a capacitor wiring 910, a gate insulating film serving as a dielectric, and a capacitor electrode electrically connected to the first pixel electrode or the second pixel electrode.

The multi-domain pixel includes a first liquid crystal element 918 and a second liquid crystal element 919. The first liquid crystal element 918 includes the first pixel electrode, a counter electrode, and a liquid crystal layer therebetween. The second liquid crystal element 919 includes the second pixel electrode, a counter electrode, and a liquid crystal layer therebetween.

Note that a pixel circuit of the present invention is not limited to that shown in FIG. 16B. For example, a switch, a resistor, a capacitor, a transistor, a sensor, a logic circuit, or the like may be added to the pixel illustrated in FIG. 16B.

<Organic EL Panel>

FIG. 16C illustrates another example of a circuit configuration of the pixel. Here, a pixel structure of a display panel using an organic EL element is illustrated.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Based on such a mechanism, such a light-emitting element is referred to as a current-excitation type light-emitting element.

FIG. 16C illustrates an example of a pixel circuit that can be used. Here, an example in which an n-channel transistor is used in the pixel is shown. Further, digital time grayscale driving can be employed for the pixel circuit.

The configuration of the pixel circuit that can be used and operation of a pixel employing digital time grayscale driving will be described.

A pixel 920 includes a switching transistor 921, a driving transistor 922, a light-emitting element 924, and a capacitor 923. A gate electrode of the switching transistor 921 is connected to a scan line 926. A first electrode (one of a source electrode and a drain electrode) of the switching transistor 921 is connected to a signal line 925. A second electrode (the other of the source electrode and the drain electrode) of the switching transistor 921 is connected to a gate electrode of the driving transistor 922. The gate electrode of the driving transistor 922 is connected to a power supply line 927 through the capacitor 923, a first electrode of the driving transistor 922 is connected to the power supply line 927, and a second electrode of the driving transistor 922 is connected to a first electrode (pixel electrode) of the light-emitting element 924. A second electrode of the light-emitting element 924 corresponds to a common electrode 928. The common electrode 928 is electrically connected to a common potential line formed over the same substrate as the common electrode 928.

As the switching transistor 921 and the driving transistor 922, any of the transistors described in the above embodiments can be used as appropriate. In this way, a highly reliable organic EL display panel can be provided.

The potential of the second electrode (the common electrode 928) of the light-emitting element 924 is set to be a low power supply potential. Note that the low power supply potential is lower than a high power supply potential supplied to the power supply line 927. For example, the low power supply potential can be GND, 0 V, or the like. The high power supply potential and the low power supply potential are set to be higher than or equal to the forward threshold voltage of the light-emitting element 924, and the difference between the potentials is applied to the light-emitting element 924, whereby current is supplied to the light-emitting element 924, leading to light emission. The forward voltage of the light-emitting element 924 refers to a voltage at which a desired luminance is obtained, and at least includes a forward threshold voltage.

Note that gate capacitance of the driving transistor 922 may be used as a substitute for the capacitor 923, so that the capacitor 923 can be omitted. The gate capacitance of the driving transistor 922 may be formed between the semiconductor film and the gate electrode.

Next, a signal input to the driving transistor 922 will be described. For a voltage-input voltage driving method, a video signal for turning on or off the driving transistor 922 without fail is input to the driving transistor 922. In order for the driving transistor 922 to operate in a subthreshold region, voltage higher than the voltage of the power supply line 927 is applied to the gate electrode of the driving transistor 922. Voltage higher than or equal to voltage which is the sum of power supply line voltage and the threshold voltage $V_{th}$ of the driving transistor 922 is applied to the signal line 925.

In the case where analog grayscale driving is performed, voltage higher than or equal to voltage which is the sum of the forward voltage of the light-emitting element 924 and the threshold voltage $V_{th}$ of the driving transistor 922 is applied to the gate electrode of the driving transistor 922. A video signal by which the driving transistor 922 is operated in a saturation region is input, so that current is supplied to the light-emitting element 924. In order for the driving transistor 922 to operate in a saturation region, the potential of the power supply line 927 is set higher than the gate potential of the driving transistor 922. When an analog video signal is used, current corresponding to the video signal can be supplied to the light-emitting element 924 and analog grayscale driving can be performed.

Note that the configuration of the pixel circuit of the present invention is not limited to that shown in FIG. 16C. For example, a switch, a resistor, a capacitor, a sensor, a transistor, a logic circuit, or the like may be added to the pixel circuit illustrated in FIG. 16C.

In the case where the transistor described in the above embodiments is used for the circuit shown in FIGS. 16A to 16C, the source electrode (the first electrode) is electrically connected to the low potential side and the drain electrode (the second electrode) is electrically connected to the high potential side. Further, the potential of the first gate electrode (and the third gate electrode) may be controlled by a control circuit or the like, and a potential lower than the potential applied to the source electrode may be input to the second gate electrode through a wiring that is not illustrated.

This embodiment can be combined with any of the other embodiments disclosed in this specification as appropriate.

Embodiment 10

A semiconductor device (including a power converter circuit, a power supply circuit, and a buffer circuit) of one embodiment of the present invention is suitable for controlling supply of power to an appliance and favorably used particularly for an appliance that needs large power. For example, the semiconductor device of one embodiment of the present invention can be favorably used for an appliance provided with a driver portion whose driving is controlled with power of a motor or the like and an appliance that controls heating or cooling by power.

Electronic appliances in which the semiconductor device of one embodiment of the present invention can be used are display devices, personal computers, image reproducing devices provided with recording media (typically, devices which reproduce the content of recording media such as digital versatile discs (DVDs) and have displays for displaying the reproduced images), and the like. Further, as electronic appliances in which the semiconductor device of one embodiment of the present invention can be used, cellular phones, game machines including portable game machines, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, high-frequency heating apparatuses such as microwave ovens, electric rice cookers, electric washing machines, electric fans, driers, air-conditioning systems such as air conditioners, raising and lowering devices such as elevators and escalators, electric refrigerators, electric freezers, electric refrigerator-freezers, electric sewing machines, electric tools, semiconductor testing devices, and the like can be given. The semiconductor device of one embodiment of the present invention may be used for a moving object powered by an electric motor. The moving object is a motor vehicle (a motorcycle or an ordinary motor vehicle with three or more wheels), a motor-assisted bicycle including an electric bicycle, an airplane, a vessel, a rail car, or the like. Further, the semiconductor device of one embodiment of the invention can be used for controlling driving of industrial robots used in a variety of fields, e.g., industries of food, home electric appliances, the moving objects, steel, semiconductor devices, civil engineering, architecture, and construction.

Specific examples of these electronic appliances are illustrated in FIGS. 17A to 17D.

Figure 17A:
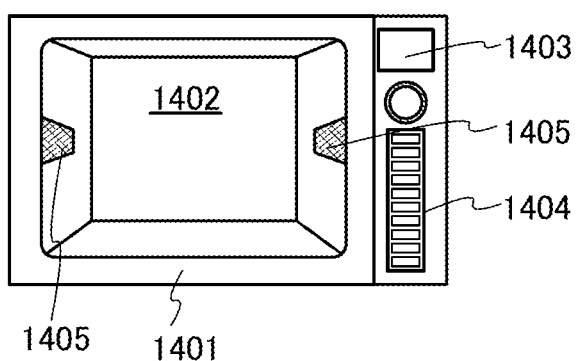
FIGS. 17A to 17D each illustrate an electronic appliance of an embodiment.

FIG. 17A illustrates a microwave oven 1400, which includes a housing 1401, a cooking chamber 1402 for placing an object, a display portion 1403, an input device (e.g., an operating panel) 1404, and an irradiation portion 1405 supplying an electromagnetic wave generated from a high-frequency wave generator provided in the housing 1401 to the cooking chamber 1402.

The semiconductor device of one embodiment of the present invention can be used, for example, in a power supply circuit that controls supply of power to the high-frequency wave generator.

Figure 17B:
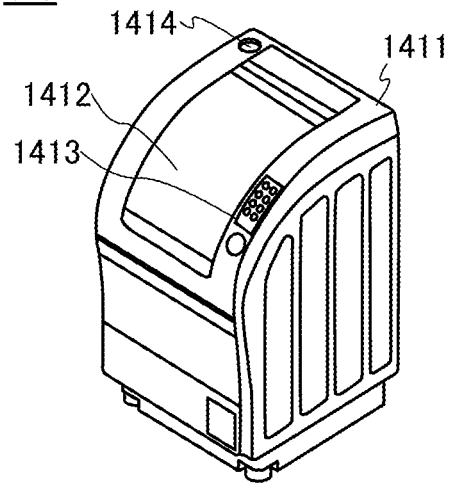

FIG. 17B illustrates a washing machine 1410, which includes a housing 1411, an open/close portion 1412 for a washing tub provided in the housing 1411, an input device (e.g., an operating panel) 1413, and a water inlet 1414 of the washing tub.

The semiconductor device of one embodiment of the present invention can be used, for example, in a circuit that controls supply of power to a motor controlling rotation of the washing tub.

Figure 17C:
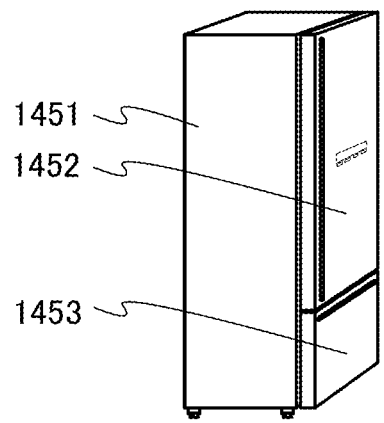

FIG. 17C is an example of an electric refrigerator-freezer. The electronic appliance illustrated in FIG. 17C includes a housing 1451, a refrigerator door 1452, and a freezer door 1453.

In the electronic appliance illustrated in FIG. 17C, the semiconductor device that is one embodiment of the present invention is provided inside the housing 1451. With this structure, supply of a power voltage to the semiconductor device in the housing 1451 can be controlled in accordance with the temperature inside the housing 1451 or in response to opening and closing of the refrigerator door 1452 and the freezer door 1453, for example.

Figure 17D:
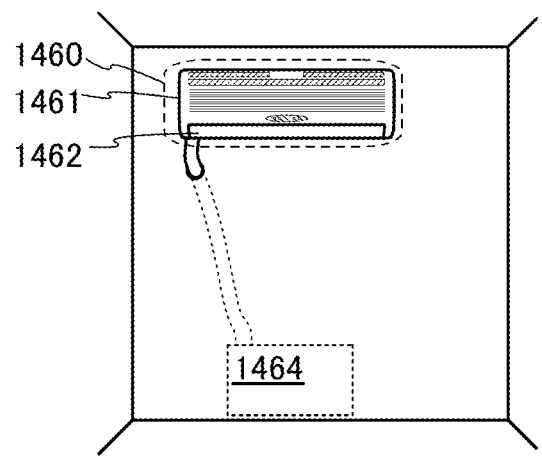

FIG. 17D illustrates an example of an air conditioner. The electronic appliance illustrated in FIG. 17D includes an indoor unit 1460 and an outdoor unit 1464.

The indoor unit 1460 includes a housing 1461 and a ventilation duct 1462.

In the electronic appliance illustrated in FIG. 17D, the semiconductor device that is one embodiment of the present invention is provided inside the housing 1461. With this structure, supply of a power supply voltage to the semiconductor device in the housing 1461 can be controlled in response to a signal from a remote controller or in accordance with the indoor temperature or humidity, for example.

The semiconductor device of one embodiment of the present invention can be used, for example, in a circuit that controls supply of power to a motor controlling rotation of a fan included in the outdoor unit 1464.

Note that the split-system air conditioner made up of the indoor unit and the outdoor unit is shown in FIG. 17D as an example; alternatively, an air conditioner may be such that the functions of an indoor unit and an outdoor unit are integrated in one housing.

This embodiment can be combined with any of the other embodiments disclosed in this specification as appropriate.

Embodiment 11

In this embodiment, structural examples of electronic appliances each using a semiconductor device of one embodiment of the present invention will be described.

FIGS. 18A to 18D are external views of electronic appliances each including the semiconductor device of one embodiment of the present invention.

Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

Figure 18A:
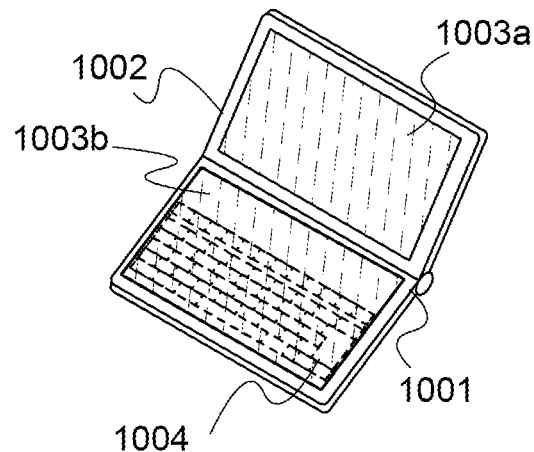
FIGS. 18A to 18D each illustrate an external view of an electronic appliance of an embodiment.

FIG. 18A illustrates a portable information terminal including a main body 1001, a housing 1002, display portions 1003a and 1003b, and the like. The display portion 1003b is a touch panel. By touching a keyboard button 1004 displayed on the display portion 1003b, a screen can be operated, and text can be input. It is needless to say that the display portion 1003a may be a touch panel. A liquid crystal panel or an organic light-emitting panel is manufactured by using any of the transistors described in the above embodiments as a switching element and used in the display portion 1003a or 1003b, whereby a highly reliable portable information terminal can be provided.

The portable information terminal illustrated in FIG. 18A has a function of displaying various kinds of data (e.g., a still image, a moving image, and a text image) on the display portion, a function of displaying a calendar, a date, the time, or the like on the display portion, a function of operating or editing the data displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing.

The portable information terminal illustrated in FIG. 18A may transmit and receive data wirelessly. Through wireless communication, desired book data or the like can be purchased and downloaded from an e-book server.

Figure 18B:
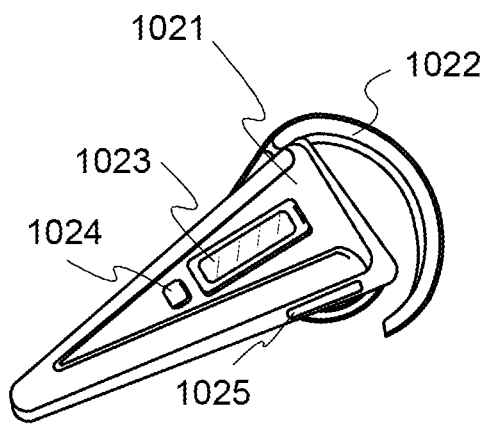

FIG. 18B illustrates a portable music player including, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is fabricated using any of the transistors described in the above embodiments as a switching element, and used in the display portion 1023, whereby a highly reliable portable music player can be provided.

Furthermore, when the portable music player illustrated in FIG. 18B has an antenna, a microphone function, or a wireless communication function and is used with a mobile phone, a user can talk on the phone wirelessly in a hands-free way while driving a car or the like.

Figure 18C:
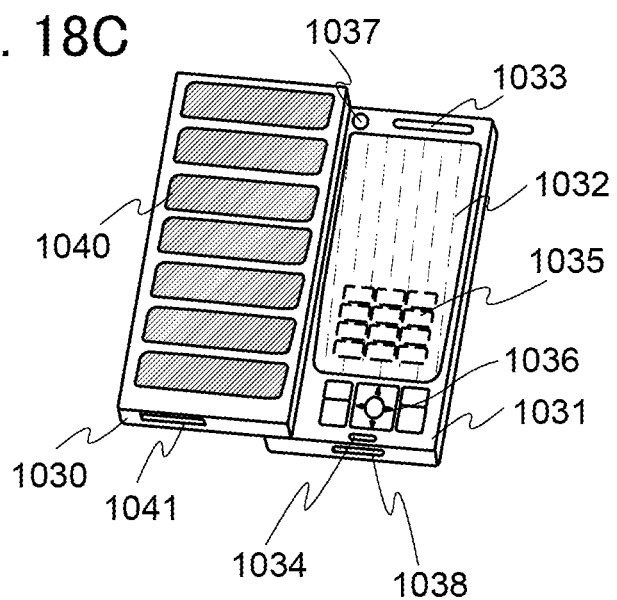

FIG. 18C illustrates a mobile phone which includes two housings, a housing 1030 and a housing 1031. The housing 1031 includes a display panel 1032, a speaker 1033, a microphone 1034, a pointing device 1036, a camera lens 1037, an external connection terminal 1038, and the like. The housing 1030 is provided with a solar cell 1040 for charging the mobile phone, an external memory slot 1041, and the like. In addition, an antenna is incorporated in the housing 1031. Any of the transistors described in the above embodiments is used in the display panel 1032, whereby a highly reliable mobile phone can be provided.

Further, the display panel 1032 includes a touch panel. A plurality of operation keys 1035 which are displayed as images are indicated by dotted lines in FIG. 18C. Note that a boosting circuit by which a voltage output from the solar cell 1040 is increased to be sufficiently high for each circuit is also included.

Any of the transistors described in the above embodiments can be used as a power transistor used for a power supply circuit such as a boosting circuit, for example.

In the display panel 1032, the direction of display is changed as appropriate depending on the application mode. Further, the mobile phone is provided with the camera lens 1037 on the same surface as the display panel 1032, and thus it can be used as a video phone. The speaker 1033 and the microphone 1034 can be used for videophone calls, recording, and playing sound, etc. as well as voice calls. Moreover, the housings 1030 and 1031 in a state where they are opened as illustrated in FIG. 18C can shift, by sliding, to a state where one is lapped over the other. Therefore, the size of the mobile phone can be reduced, which makes the mobile phone suitable for being carried around.

The external connection terminal 1038 can be connected to an AC adaptor and a variety of cables such as a USB cable, whereby charging and data communication with a personal computer or the like are possible. Further, by inserting a recording medium into the external memory slot 1041, a larger amount of data can be stored and moved.

Further, in addition to the above functions, an infrared communication function, a television reception function, or the like may be provided.

Figure 18D:
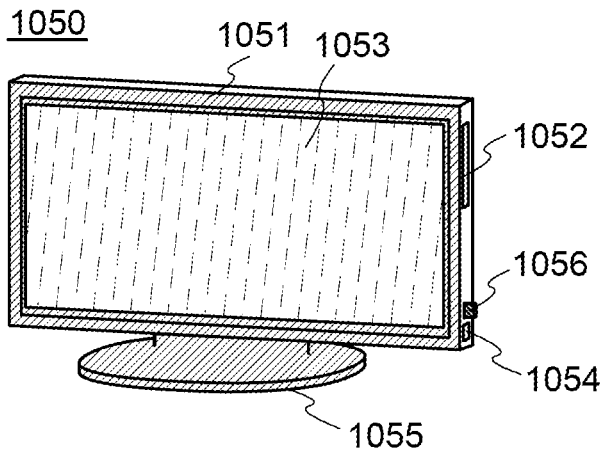

FIG. 18D illustrates an example of a television set. In a television set 1050, a display portion 1053 is incorporated in a housing 1051. Images can be displayed on the display portion 1053. Moreover, a CPU is incorporated in a stand 1055 for supporting the housing 1051. Any of the transistors described in the above embodiments is used in the display portion 1053 and the CPU, whereby the television set 1050 can have high reliability.

The television set 1050 can be operated with an operation switch of the housing 1051 or a separate remote controller. Further, the remote controller may be provided with a display portion for displaying data output from the remote controller.

Note that the television set 1050 is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

Further, the television set 1050 is provided with an external connection terminal 1054, a storage medium recording and reproducing portion 1052, and an external memory slot. The external connection terminal 1054 can be connected to various types of cables such as a USB cable, and data communication with a personal computer or the like is possible. A disk storage medium is inserted into the storage medium recording and reproducing portion 1052, and reading data stored in the storage medium and writing data to the storage medium can be performed. In addition, an image, a video, or the like stored as data in an external memory 1056 inserted into the external memory slot can be displayed on the display portion 1053.

Further, in the case where the off-state leakage current of the transistor described in the above embodiments is extremely small, when the transistor is used in the external memory 1056 or the CPU, the television set 1050 can have high reliability and sufficiently reduced power consumption.

This embodiment can be combined with any of the other embodiments disclosed in this specification as appropriate.

This application is based on Japanese Patent Application serial no. 2013-159512 filed with Japan Patent Office on Jul. 31, 2013, the entire contents of which are hereby incorporated by reference.

What is claimed is:
1. A semiconductor device comprising:
a first gate electrode;
a first gate insulating film over the first gate electrode;
an oxide semiconductor film over the first gate insulating film;
a second gate insulating film over the oxide semiconductor film; and
a second gate electrode over the second gate insulating film,
wherein the oxide semiconductor film comprises a first channel region and a second channel region,
wherein the first gate electrode and the first channel region overlap each other,
wherein the first gate electrode and the second channel region do not overlap each other,
wherein the second gate electrode and the first channel region overlap each other,
wherein the second gate electrode and the second channel region overlap each other, and
wherein the first channel region and the second channel region are electrically connected in series.

2. The semiconductor device according to claim 1, further comprising a low-resistance region,
wherein the first channel region and the second channel region are electrically connected in series through the low-resistance region.

3. The semiconductor device according to claim 1,
wherein the second gate electrode comprises a first region that overlaps the first channel region and a second region that overlaps the second channel region, and
wherein the first region and the second region of the second gate electrode are separated from each other over the oxide semiconductor film.

4. The semiconductor device according to claim 1, wherein a first channel width of the first channel region is different from a second channel width of the second channel region.

5. The semiconductor device according to claim 1, further comprising a first conductive film, a second conductive film, and a third conductive film that are over and in contact with the oxide semiconductor film,
  wherein the first channel region is between the first conductive film and the second conductive film, and
  wherein the second channel region is between the second conductive film and the third conductive film.

6. The semiconductor device according to claim 5,
  wherein the first conductive film is one of a source electrode and a drain electrode, and
  wherein the third conductive film is the other of the source electrode and the drain electrode.

7. A semiconductor device comprising:
  a first gate electrode;
  a first gate insulating film over the first gate electrode;
  a first oxide semiconductor film and a second oxide semiconductor film over the first gate insulating film;
  a second gate insulating film over the first oxide semiconductor film and the second oxide semiconductor film; and
  a second gate electrode over the second gate insulating film,
  wherein the first oxide semiconductor film comprises a first channel region,
  wherein the second oxide semiconductor film comprises a second channel region,
  wherein the first gate electrode and the first channel region overlap each other,
  wherein the first gate electrode and the second channel region do not overlap each other,
  wherein the second gate electrode and the first channel region overlap each other,
  wherein the second gate electrode and the second channel region overlap each other, and
  wherein the first channel region and the second channel region are electrically connected in series.

8. The semiconductor device according to claim 7, further comprising a conductive film,
  wherein the first channel region and the second channel region are electrically connected in series through the conductive film.

9. The semiconductor device according to claim 8,
  wherein the second gate electrode comprises a first region that overlaps the first channel region and a second region that overlaps the second channel region, and
  wherein the first region and the second region of the second gate electrode are separated from each other over the conductive film.

10. The semiconductor device according to claim 7, wherein a first channel width of the first channel region is different from a second channel width of the second channel region.

11. The semiconductor device according to claim 7, further comprising:
  a first conductive film over and in contact with the first oxide semiconductor film;
  a second conductive film over and in contact with the first oxide semiconductor film and the second oxide semiconductor film; and
  a third conductive film over and in contact with the second oxide semiconductor film,
  wherein the first channel region is between the first conductive film and the second conductive film,
  wherein the second channel region is between the second conductive film and the third conductive film, and
  wherein the second conductive film is between the first oxide semiconductor film and the second oxide semiconductor film.

12. The semiconductor device according to claim 11,
  wherein the first conductive film is one of a source electrode and a drain electrode, and
  wherein the third conductive film is the other of the source electrode and the drain electrode.

* * * * *